(12) United States Patent  
Kawamura et al.

(10) Patent No.: US 10,910,038 B2  
(45) Date of Patent: Feb. 2, 2021

(54) DRAM ARRAY ARCHITECTURE WITH ROW HAMMER STRESS MITIGATION

(71) Applicant: Micron Technology, Inc., Boise, ID (US)

(72) Inventors: Christopher J. Kawamura, Boise, ID (US); Charles L. Ingalls, Meridian, ID (US); Tae H. Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 61 days.

(21) Appl. No.: 16/399,283

(22) Filed: Apr. 30, 2019

(65) Prior Publication Data

US 2020/0349999 A1  Nov. 5, 2020

(51) Int. Cl.
*G11C 5/14* (2006.01)
*G11C 11/408* (2006.01)
*G11C 11/4076* (2006.01)

(52) U.S. Cl.
CPC ...... *G11C 11/4085* (2013.01); *G11C 11/4076* (2013.01); *G11C 11/4087* (2013.01)

(58) Field of Classification Search
CPC .................................. G11C 5/147; G11C 8/10
USPC ..................................................... 365/230.06
See application file for complete search history.

(56) References Cited

U.S. PATENT DOCUMENTS

| | | | | |
|---|---|---|---|---|
| 5,875,149 | A | * | 2/1999 | Oh ........................... G11C 8/08 365/230.06 |
| 2010/0046313 | A1 | * | 2/2010 | Lee ..................... G11C 11/4085 365/230.06 |
| 2013/0286754 | A1 | * | 10/2013 | Jung ...................... G11C 16/26 365/189.06 |
| 2018/0308530 | A1 | * | 10/2018 | Kim ......................... G11C 8/10 |

OTHER PUBLICATIONS

Unpublished U.S. Appl. No. 16/399,159 by Charles L. Ingalls et al.; filed Apr. 30, 2019; titled "FX Driver Circuit"; 48 pages.
Unpublished U.S. Appl. No. 16/399,197 by Charles L. Ingalls et al.; filed Apr. 30, 2019; titled "Sub-Word Line Driver Circuit"; 49 pages.
Unpublished U.S. Appl. No. 16/399,235 by Tae H. Kim et al.; filed Apr. 30, 2019; titled "Main Word Line Driver Circuit"; 51 pages.

* cited by examiner

*Primary Examiner* — Hoai V Ho
*Assistant Examiner* — Minh Dinh
(74) *Attorney, Agent, or Firm* — Perkins Coie LLP

(57) ABSTRACT

An apparatus includes a plurality of main word line circuits. Each main word line circuit drives a respective global word line to one of an active state value, an intermediate voltage state, or a pre-charge state. The intermediate voltage state voltage is below the active state voltage and above the pre-charge state voltage. The memory device also includes a plurality of sub-word line drivers. Each sub-word line driver is connected to a corresponding global word line and configured to drive a respective local word line between the corresponding global word line voltage and a low voltage value. The apparatus further includes a plurality of phase (Continued)

drivers. Each phase driver is connected to a predetermined number of sub-word line drivers, where each of the predetermined number of sub-word line drivers connects to a different global word line.

18 Claims, 10 Drawing Sheets

DRAM ARRAY ARCHITECTURE WITH ROW HAMMER STRESS MITIGATION

CROSS-REFERENCE TO RELATED APPLICATIONS

This application contains subject matter related to an U.S. Patent Application by Charles L. Ingalls et al., titled "FX DRIVER CIRCUIT". The related application is assigned to Micron Technology, Inc., and is identified as U.S. patent application Ser. No. 16/399,159, filed Apr. 30, 2019. The subject matter thereof is incorporated herein by reference thereto.

This application contains subject matter related to an U.S. Patent Application by Charles L. Ingalls et al., titled "SUB-WORD LINE DRIVER CIRCUIT". The related application is assigned to Micron Technology, Inc., and is identified as U.S. patent application Ser. No. 16/399,197, filed Apr. 30, 2019. The subject matter thereof is incorporated herein by reference thereto.

This application contains subject matter related to an U.S. Patent Application by Tae H. Kim et al., titled "MAIN WORD LINE DRIVER CIRCUIT". The related application is assigned to Micron Technology, Inc., and is identified as U.S. patent application Ser. No. 16/399,235, filed Apr. 30, 2019. The subject matter thereof is incorporated herein by reference thereto.

TECHNICAL FIELD

Embodiments of this invention relate to the architecture of a DRAM memory device and methods of mitigating row hammer stress in the DRAM memory device.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including random-access memory (RAM), static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), ferroelectric random access memory (FeRAM), resistive random access memory (RRAM), and magnetic random access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

Memory devices employ a variety of signals within the various circuits of the memory device. Signal drivers for applying the signals to signal lines are in common use in electronic devices, such as integrated circuits. One such signal driver can be used to apply voltages to word lines in an array of memory cells. The word lines may extend through a memory cell array from a set of global word line drivers (also referred to herein as "main word line drivers" and "MWDs"). The global word line driver may selectively actuate each of the word lines responsive to the memory device receiving a row address corresponding to the word line. Each of the memory cells in the row corresponding to the received row address then applies stored data to a respective sense amplifier.

Some semiconductor memory devices, such as DRAM, store information as charge accumulated in cell capacitors ("cells"), with the cells organized into rows. In some cases, charge applied to cells in one row can interfere with charge in one or more adjacent "victim" rows or cells can otherwise lose their charge, an occurrence referred to as "leakage." Certain instances of leakage can occur when memory rows experience "row hammering," which is when a row is repeatedly driven to an active level in a short time (e.g., over a duration less than that between sequential refresh operations) and the activations affect one or more adjacent victim rows. This can result in changes to cell charges in the victim rows, putting the information stored there at risk.

Various memory systems use one or more strategies to address leakage, such as row hammer stress mitigation or target row refreshing (TRR). Row hammer stress mitigation can include a host or controller automatically performing refresh operations on victim rows on a random or periodic basis. In some embodiments, row hammer stress mitigation can include controlling the local word line voltage such that, when going from an active level to a pre-charge or standby level, the local word line voltage is paused at an intermediate voltage level for a predetermined time period. By pausing at an intermediate voltage, adjacent memory rows do not experience the effects of a rapid change in voltage levels and the row hammer stress can be mitigated.

Each of the word lines extending through the array may be relatively long and, as a result, may have substantial capacitance. Furthermore, the word lines may be fabricated of polysilicon, which may have a relatively high resistance. The combination of the relatively high capacitance and relatively high resistance of the word lines may make it difficult for the global word line driver to quickly switch signal levels on the word lines, particularly in portions of the memory cell array that are more distant from the global word line driver. To alleviate this problem, it is conventional for memory cell arrays to be divided into smaller memory cell arrays, and to fabricate local word line drivers (also referred to herein as "sub-word line drivers" and "SWDs") between at least some of these smaller memory cell arrays. The local word line drivers may receive substantially the same signals that are used to control the global word line drivers to drive the word lines so that they may apply the same levels to the word lines that the global word line driver applies to the word lines.

The use of local word line drivers can improve the switching speed of word lines and prior art designs generally include at least one PMOS transistor and at least one NMOS transistor in each local word line driver. Use of PMOS transistors allows for the local word line voltage to be the same as the global word line voltage using lower phase voltages than for NMOS-only local word line drivers due to the threshold voltages of NMOS transistors. However, while NMOS transistors used in the local word line drivers can be fabricated in the same p-type substrate as the access transistors for the memory cells, the PMOS transistors used in the local word drivers can require the fabrication of an n-well in the p-type substrate to provide the n-type material for the fabrication of the PMOS transistors. Forming a n-well for each of the local word line drivers can greatly increase the area of a semiconductor substrate used for fabricating the local word line drivers, thereby potentially either increasing the cost or reducing the capacity of the memory devices.

DETAILED DESCRIPTION

As discussed in greater detail below, the technology disclosed herein relates to signal drivers for word line drivers and associated circuits in memory systems and devices. A person skilled in the art, however, will understand that the technology may have additional embodiments and that the technology may be practiced without several of the details of the embodiments described below with reference to FIGS. 1-6. In the illustrated embodiments below, the memory devices and systems are primarily described in the context of devices incorporating DRAM storage media. Memory devices configured in accordance with other embodiments of the present technology, however, can include other types of memory devices and systems incorporating other types of storage media, including PCM, SRAM, FRAM, RRAM, MRAM, read only memory (ROM), erasable programmable ROM (EPROM), electrically erasable programmable ROM (EEROM), ferroelectric, magnetoresistive, and other storage media, including non-volatile, flash (e.g., NAND and/or NOR) storage media.

Figure 1:
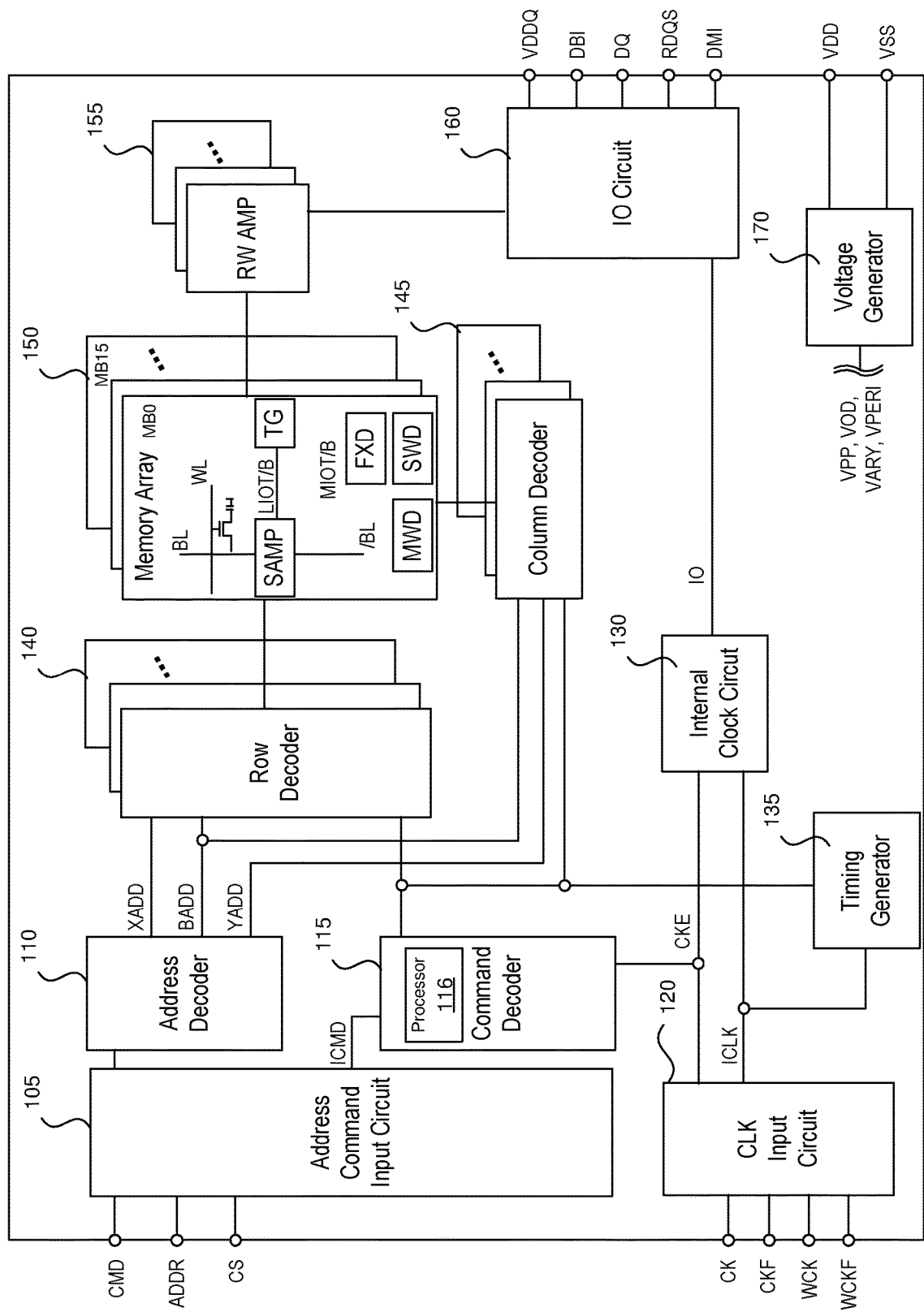
FIG. 1 is block diagram of an embodiment of a memory system in accordance with the present disclosure.

FIG. 1 is a block diagram schematically illustrating a memory device 100 in accordance with an embodiment of the present technology. The memory device 100 may include an array of memory cells, such as memory array 150. The memory array 150 may include one or more banks MB (e.g., banks MB0 to MB15 in the example of FIG. 1), and each bank may include a plurality of word lines (WL), one or more bit lines (BL), and one or more memory cells arranged at intersections of the word lines and the bit lines. The selection of a word line WL and the signal voltage on the word line WL can be performed by a row decoder 140 in combination with the corresponding MWDs, SWDs, and FX phase drivers ("FX drivers," "phase drivers," or "FXDs"). The MWDs, SWDs, and FXDs are discussed in further detail below. The selection of a bit line BL can be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches.

The memory device 100 may employ a plurality of external terminals to communicate with an external memory controller and/or host processor (not shown). The external terminals can include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ.

The command terminals and address terminals may be supplied with an address signal and a bank address signal from an external memory controller and/or host processor. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD can be provided as internal command signals ICMD to a command decoder 115 via the command/address input circuit 105. The command decoder 115 can include a processor 116 and/or other circuits to decode the internal command signals ICMD to generate various internal signals and commands for performing memory operations. For example, the processor 116 can execute the instructions to and/or other circuits can be configured to generate row and column command signals and/or the associated timing signals (e.g., in coordination with the timing generator 135) to select a word line and/or a bit line to perform the desired memory operation. Of course, the processor/circuitry to generate the command and/or timing signals can be located in another component of the memory device 100 such as, for example, address command input circuit 105 and/or an external controller/processor. The internal command signals can also include output and input activation commands, such as clocked command CMDCK.

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160 and supplied via the input/output circuit 160 and the read/write amplifiers 155 to the memory array 150. The write data may be written in the memory cell designated by the row address and the column address. The write data may be provided to the data terminals at a time that is defined by write latency WL information. Operation of the I/O circuit 160 is known to those skilled in the art and thus, for brevity, will not be discussed The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, VCC, VCCP, VCCP2, and the like based on the power supply potentials VDD, VNWL, and VSS. The internal potential VPP can be used in the row decoder 140, the internal potentials VOD and VARY can be used in the sense amplifiers included in the memory array 150, and the internal potential VPERI can be used in many other circuit blocks.

Clock input circuit 120 can receive external clock signal and generate various internal clock signals. For example, the clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (ITO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

Figure 2:
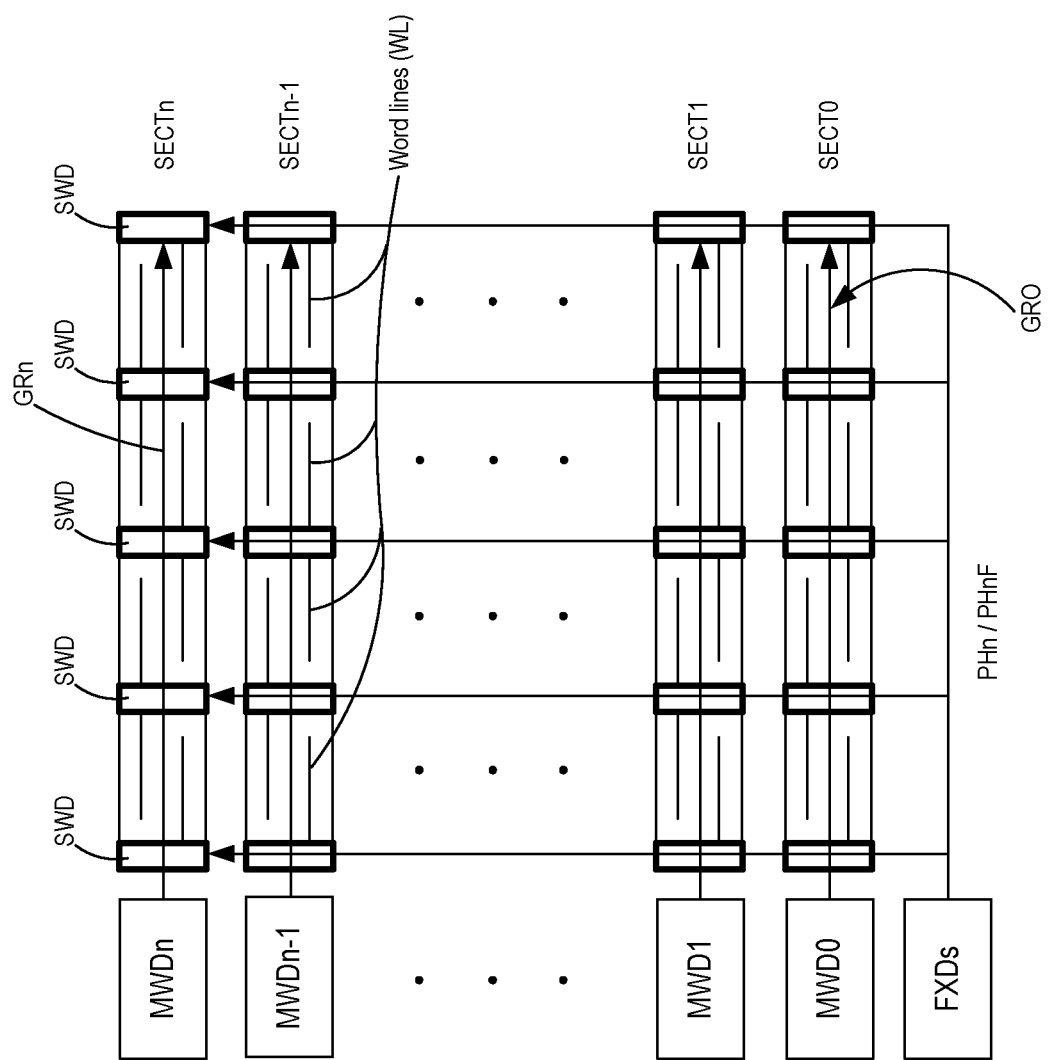
FIG. 2 is a block diagram of a portion of a memory bank array that can be used in the memory system of FIG. 1.

FIG. 2 illustrates a simplified block diagram of an exemplary structure of a memory bank MB of the memory array 150. As shown in FIG. 2, each memory bank MB can include one or more memory array sections SECT (e.g., SECT0 to SECTn) having a group of memory cells. Each memory array section SECT includes an MWD (e.g., MWD0 to MWDn) which outputs the appropriate signal voltage on the corresponding global word line GR (e.g., GR0 to GRn). For example, when in an active or high state, the MWD can output a voltage level on the global word line GR that is at Vcc (e.g., in a range from about 2.3 volts to 2.7 volts such as, for example, 2.5 volts), at Vccp (e.g., in a range from about 3.0 volts to 3.5 volts such as, for example, 3.2 volts), or at some other voltage level corresponding to an active or high state. When in a pre-charge or standby state, the MWD can output a voltage level on the global word line GR that is at Vss (e.g., ground or 0 volts), at Vnw1 (e.g., in a range from about −0.1 volts-0.25 volts such as, for example, −0.2 volts), or at some other voltage level corresponding to a pre-charge or standby state. When row hammer stress mitigation is enabled, during the transition from the active or high state to the pre-charge or standby state, the MWD can output an intermediate voltage level on the global word line GR that is at Voff (e.g., 0.25 volts to 0.75 volts such as, for example, 0.5 volts). While the global word line GR can be directly coupled to the memory cells in the memory bank MB, the global word line GR extending through the memory bank MB can have substantial capacitance and resistance, as discussed above. The capacitance and resistance can reduce the speed at which each MWD drives the respective global word line GR. To mitigate this problem, each global word line GR can be coupled to one or more SWDs. For example, in some embodiments, each global word line can connect to eight SWDs, sixteen SWDs, or some other desired number of SWDs. The SWDs can be fabricated between at least some of the memory cell arrays in memory bank MB. Each SWD outputs the appropriate signal voltage on the corresponding local word line WL (e.g., WL0 to WLn). For example, when in an active or high state, the SWD can output a voltage level on the local word line WL that is at Vcc (e.g., in a range from about 2.3 volts to 2.7 volts such as, for example, 2.5 volts), at Vccp (e.g., in a range from about 3.0 volts to 3.5 volts such as, for example, 3.2 volts), or at some other voltage level corresponding to an active or high state. When in a pre-charge or standby state, the SWD can output a voltage level on the local word line WL that is at Vss (e.g., ground or 0 volts), at Vnw1 (e.g., in a range from about −0.1 volts-0.25 volts such as, for example, −0.2 volts), or at some other voltage level corresponding to a pre-charge or standby state. When row hammer stress mitigation is enabled, during the transition from the active or high state to the pre-charge or standby state, the SWD can output an intermediate voltage level on the local word line WL that is at Voff (e.g., 0.25 volts to 0.75 volts such as, for example, 0.5 volts). Depending on the type of SWD circuit, the high signal voltage value on the local word line WL can be the same as that of the global word line GR or lower than that of the global word line GR by a transistor threshold voltage Vt.

Each memory bank MB includes one or more FXDs that provide phase signals PH and PHF, which are used to select the SWD based on decoded row address signals and timing control signals. As seen in FIG. 2, the PH and/or PHF signals can be provided to a SWD in one or more sections SECT0-SECTn for selecting the appropriate SWD. For example, in some embodiments, each set of PH/PHF signals from a FXD can be connected to a SWD in each of a predetermined number of sections in sections SECT0 to SECTn. The predetermined number of sections can be seven sections, and the set of PH/PHF signals can be connected to a SWD in each of the seven sections. However, in other exemplary embodiments, the predetermined number can be more than seven sections or less than seven sections. The FXD is discussed in greater detail below.

Figure 3A:
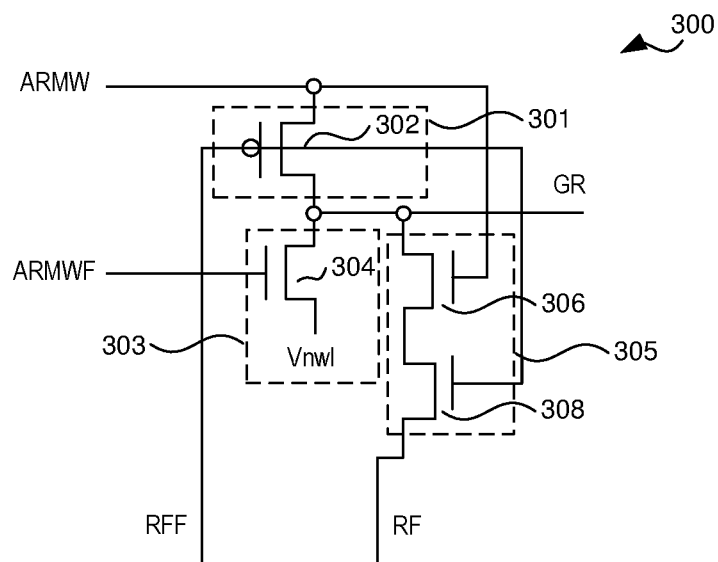
FIG. 3A is a schematic of an embodiment of a main word line driver in accordance with the present disclosure.

FIG. 3A illustrates an exemplary embodiment of a main word line driver 300. The MWD 300 can include a transistor 302 of a first type, such as, for example, a PMOS transistor, having a source coupled to a signal ARMW. The voltage of signal ARMW and its complement ARMWF can correspond to a decoded address signal such as, for example, the first portion of a decoded row address. For example, the decoded row address ARMW (ARMWF) can correspond to one or more MWDs of a memory bank MB. The drain of the transistor 302 can be connected to a drain of transistor 304 that can be different from the first type, such as, for example a NMOS transistor. The interconnected drains of the transistors 302, 304 are coupled to a global word line GR. The source of transistor 304 can be connected to a voltage source that can be, for example, in a range of −0.25 volts to 0 volts. For example, as seen in FIG. 3A, the voltage source is at Vnw1. However, in other embodiments, the voltage source can be at Vss or at some other low voltage value. The gate of the transistor 304 can be connected to the ARMWF signal. The gate of the transistor 302 is driven by the RFF signal. The RFF and RF signals can correspond to a portion of a decoded row address that can relate to, for example, one or more MWDs of a memory bank MB.

In addition to transistors 302 and 304, the MWD 300 can include series-connected transistors 306 and 308, which can be, for example, NMOS transistors. The drain of transistor 306 can be connected to global word line GR and the source of transistor 306 can be connected to the drain of transistor 308. The gate of transistor 306 can be connected to the decoded address signal ARMW, and the gate of transistor 308 can be connected to the RFF signal. The source of transistor 308 can be connected to the RF signal. Based on the voltage values (high or low) for the ARMW, ARMWF, RF, and/or RFF signals, the MWD sets the corresponding global word line GR to an active state or a pre-charge or standby state. As discussed above, an active state or high state for the global word line GR can be at Vcc, at Vccp, or at other voltage level corresponding to an active or high state, and the pre-charge or standby state for the global word line GR can be at Vss, at Vnw1, or at some other voltage level corresponding to a pre-charge or standby state. The high state for the ARMW, ARMWF, RF, and RFF signals can be, for example, a voltage in a range of 2.3 volts to 3.5 volts, and the low state can be a voltage in a range of −0.25 volts to 0 volts (ground). For example, when in the high state, the ARMW, ARMWF, RF, and RFF signals can be at a voltage level corresponding to Vcc (e.g., in a range from about 2.3 volts to 2.7 volts such as, for example, 2.5 volts), to Vccp (e.g., in a range from about 3.0 volts to 3.5 volts such as, for example, 3.2 volts), or to some other voltage level corresponding to a high state of the signals. When in low state, the ARMW, ARMWF, RF, and RFF signals can be at a voltage level corresponding to Vss (e.g., ground or 0 volts), to Vnw1 (e.g., in a range from about −0.1 volts-0.25 volts such as, for example, −0.2 volts), or to some other voltage level corresponding to low state.

The value of the high state is not necessarily the same for all the signals. For example, one or more of the signals can have a high state at 3.2 volts while one or more of the remaining signals have a high state at 2.5 volts (or some other appropriate high voltage value). Similarly, the value of the low state is not necessarily the same for all the signals. For example, one or more of the signals can have a low state at −0.2 volts while one or more remaining signals have a low state at 0 volts (or some other appropriate low voltage value). In some embodiments, the high state can be based on a high voltage source such as, for example, Vcc, Vccp, or some other high voltage source, and the low state can be based on a low voltage source such as, for example, Vss, vnw1, or some other low voltage source. In some embodiments, one or more signals (e.g., the RF signal) and/or the global word line GR can be set to an intermediate voltage state Voff to mitigate the effects of row hammer stress.

In operation, the MWD 300 receives the ARMW, ARMWF, RF, and RFF signals and then sets the state of the global word line GR based the value of the signals. The processor 116 (and/or another processor) can control the decoded row address signals ARMW/ARMWF and RF/RFF to operate the MWD 300. The circuits (not shown) to generate the ARMW and ARMWF signals are known in the art and thus, for brevity, will not be discussed further. An exemplary RF driver circuit to generate the RF and RFF signals (also referred to herein as "row factor" signals) in accordance with an embodiment of the present disclosure is shown in FIG. 3C. The MWD 300 can include a pull-up circuit 301, a pull-down circuit 304 and an intermediate voltage circuit 305. The pull-up circuit 302 can include a PMOS transistor 302. The source of the PMOS transistor 302 can be connected to the decoded address signal ARMW and the gate of the PMOS transistor 302 can be connected to the row factor signal RFF. The drain of the PMOS transistor can be connected to global word line GR. The pull-down circuit 303 can include a NMOS transistor 304. The drain of the NMOS transistor 304 can be connected to the global word line GR and the gate of the NMOS transistor 304 can be connected to decoded address signal ARMWF. The source of the NMOS 304 can be connected to a low voltage source, such as, for example, Vnw1 (or, e.g., Vss or another low voltage source). The MWD 300 can also include an intermediate voltage circuit 305. The intermediate voltage circuit 305 includes a NMOS transistor 306 connected in series with a NOMS transistor 308. The drain of the NMOS transistor 306 can be connected to the global word line GR and the gate of the NMOS transistor can be connected to decoded address signal ARMW. The source of the NMOS transistor 306 can be connected to the drain of the NMOS transistor 308. The gate of the NMOS transistor 308 can be connected to row factor signal RFF and the source of the NMOS transistor 308 can be connected to row factor signal RF. As discussed below, the intermediate voltage circuit 305 allows for the voltage on the global word line GR to be pulled down to an intermediate voltage between the active voltage state and the pre-charge voltage state for row hammer stress mitigation. Of course, in some embodiments, the functions of the pull-down circuit 304 and the intermediate voltage circuit 305 can be incorporated into a single circuit.

Figure 3B:
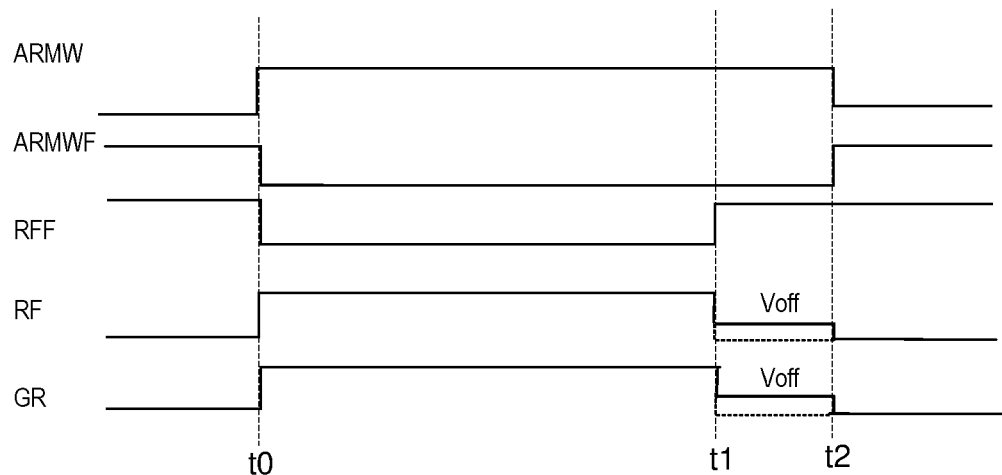
FIG. 3B is a signal timing diagram of the main word line driver of FIG. 3A.
Figure 3C:
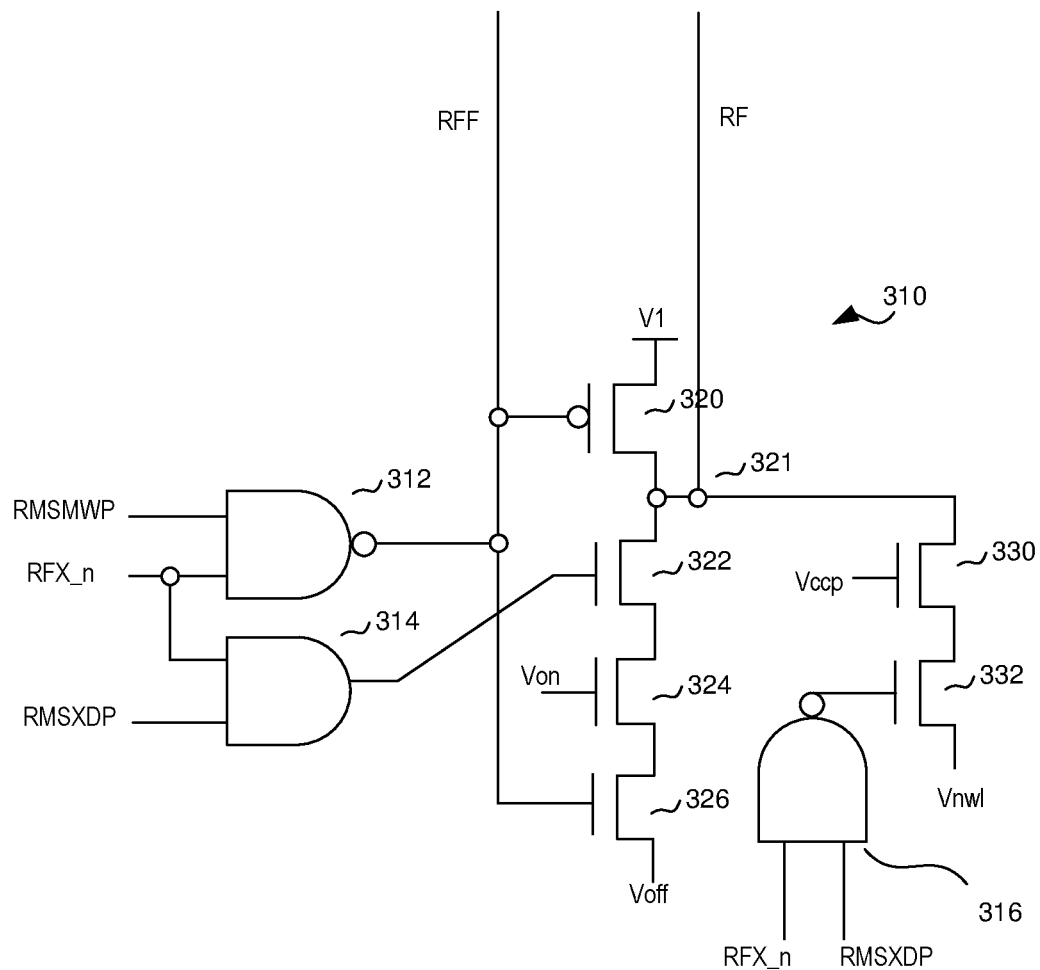
FIG. 3C is a schematic of an embodiment of a RF driver with optional row hammer stress mitigation in accordance with the present disclosure for the main word line driver of FIG. 3A.

With reference to FIGS. 3A and 3B, the MWD 300 can be configured so that the global word line GR is set at the active or high state if the ARMW signal is at a high state and the RFF signal is at a low state (see signals at t0). With the RFF signal in the low state and the ARMW signal in the high state, the transistor 302 will be ON to pull up the global word line GR to the value of the ARMW signal, which can be at Vcc, at Vccp, or at some other appropriate high voltage value. With the RFF signal in the low state, the transistor 308 will be OFF to isolate the global word line GR from the value of the RF signal. Those skilled in the art understand that "isolate" as used herein means a practical isolation between the source and drain of a transistor and does not necessarily mean a total electrical isolation as some leakage current in the transistor can exist in some circumstances. In addition, with the ARMWF signal at the low state, transistor 304 will be OFF to isolate the global word line GR from the voltage source Vnw1 (or, e.g., Vss or some other low voltage source).

In some embodiments, when transitioning from the active or high state to the pre-charge or standby state, the MWD 300 enters an intermediate voltage state (or row hammer stress mitigation state) prior to entering the pre-charge or standby state. For example, at time t1, when the RFF signal is set to a high state, the RF signal is set to an intermediate state having a voltage Voff for a predetermined period of time (e.g., from time t1 to t2). In some embodiments, Voff can be a value in a range of 0.25 volts to 0.75 volts such as, for example, 0.5 volts. Turning to FIG. 3A, with the RFF and ARMW signals set at a high state, the transistors 306 and 308 are ON to pull down the value of the global word line GR to the value of the RF signal, which is at Voff. In addition, with the RFF signal in a high state, the transistor 302 is OFF to isolate the value of the ARMW signal from the global word line GR. Thus, in this embodiment, the global word line GR transitions from an active or high state to an intermediate voltage Voff prior to transitioning to a pre-charge or standby state at time t2. By limiting the step change in voltage when going from the active or high state to the pre-charge or standby state, adjacent word lines WL in the memory bank MB do not experience the effects of a rapid change in voltage levels and row hammer stress can be mitigated. In some embodiments when row hammer stress mitigation is not required or desired, the RF signal is not set to Voff and the global word line GR transitions from the active or high state to the pre-charge or stand by state without going to an intermediate voltage first (see, for example, the dotted line in FIG. 3B).

In some embodiments, at either time t1 (no row hammer stress mitigation) or time t2 (with row hammer stress mitigation), the ARMWF signal can be set to a high state to turn ON the transistor 304 to connect the global word line GR to Vnw1 (or, e.g., Vss or some other low voltage source). With ARMW now at a low state, transistor 306 will be OFF to isolate the RF signal from the global word line GR. In addition, the value of the RFF signal is at a high state to ensure transistor 302 is OFF to isolate the global word line GR from the ARMW signal. Table 1 provides a logic table illustrating the state (A-active, P-pre-charge, or I-intermediate voltage (row hammer stress mitigation) of the global word line GR based on the state of the decoded address signals and row factor signals for MWD 300.

TABLE 1

| ARMW | ARMWF | RFF | RF | GR |
|---|---|---|---|---|
| L | H | H | L | P |
| H | L | L | H | A |
| H | L | H | I | I |

FIG. 3C is a schematic of an exemplary embodiment of a row factor driver circuit ("RF driver circuit") with row hammer stress mitigation. As seen in FIG. 3C, the RFF and RF signals used by the MWD 300 can be generated by RF driver circuit 310. The RF driver circuit 310 can receive input signals RMSMWP, RFX_n, and RMSXDP, which are decoded row address and/or timing signals from a row decoder (not shown). For example, the RFX_n signal can be a decoded address signal that corresponds to a memory bank and/or one or more MWDs of the memory bank, where X can represent a memory bank and n can represent the corresponding one or more MWDs within the memory bank. The RMSMWP and RMSXDP signals can be timing signals for generating the RFF and RF signals used in the operation of the corresponding one or more MWDs.

Prior to time t0 (see FIG. 3B), the RFX_n signal can be set at a low state, which can mean that the pertinent memory bank and/or the corresponding one or more MWDs are not selected for operation. That is, with the RFX_n signal at the low state, the output of NAND gate circuit 312 and thus the RFF signal is high to isolate the global word line GR from the ARMW signal. In addition, a low RFX_n signal means that the output of NAND gate circuit 316 is also high. With a high output on the NAND gate circuit 316, NMOS transistor 332 is ON. Because NMOS transistor 330 is a continuously gated transistor, the node 321 and thus the RF signal is pulled down to the value of Vnw1 (or, e.g., Vss, or some other low voltage source) via the transistor 332. Thus, prior to t0, the RFF and RF signals to the MWD 300 will be high and low, respectively.

In addition, with a low RFX_n signal, the output of AND gate circuit 314 is low and NMOS transistor 322 is OFF, which isolates voltage Voff (used in row hammer stress mitigation) from node 321 even though the NMOS transistor 326 is ON due to the high RFF signal. Similarly, the PMOS transistor 320 is OFF to isolate the voltage V1 from the node 321. The PMOS transistor 320 is OFF because the source voltage V1, in some embodiments, is set to be lower than the high voltage value of the RFF signal. For example, if the high voltage value of the RFF is at Vccp, then the voltage V1 can be Vccp-Vt, where Vt is the threshold voltage of the transistor 320 (e.g., if Vccp=3.2 volts and Vt is 0.7 volts, then V1 is 2.5 volts). The voltage V1 can be set to be below the high voltage value of the RFF signal by at least the threshold voltage of the transistor 320 in order to prevent unreliable operation of the transistor 320.

The RFX_n signal can be set to high state (e.g., corresponding to time t0 in FIG. 3B) to select the pertinent memory bank and/or the corresponding one or more MWDs for operation. In some embodiments, when RFX_n is in the high state, the timing signals RMSWMP and RMSXDP are also set to the high state. With the RFX_n and RMSWMP signals at the high state, the output of NAND gate circuit 312 is low, which means the RFF signal is low. A low signal value on RFF means that the ARMW signal is connected to the global word line GR in MWD 300. In addition, a low signal value on RFF means that NMOS transistor 326 is OFF to isolate Voff from node 321. With RFF low, PMOS transistor 320 is turned ON to pull up node 321 and thus the RF signal high to the voltage V1. In some embodiments, V1 can be 2.5 volts and the RF signal can be pulled up to a value of 2.5 volts. With the RFX_n and RMSXDP signals at the high state, the NMOS transistor 322 is ON but because NMOS transistor 326 is OFF, the node 321 remains isolated from the voltage source Voff. To prevent unreliable operation, a continuously gated NMOS transistor 324 is provided in series between NMOS transistor 322 and NMOS transistor 326. The NMOS transistor 324 has a gate voltage Von that is sufficient to keep transistor 324 continuously gated. The inclusion of continuously gated transistor 324 provides more reliability to the RF driver circuit 310 by providing a resistive path for the leakage current going through NMOS transistor 326 to create a voltage drop in the leakage current path when the NMOS transistor 326 is OFF.

With the RFX_n and RMSXDP signals at the high state, the output of NAND gate circuit 316 is low, which means that NMOS transistor 332 is OFF to isolate node 321 from the voltage source Vnw1 (or e.g., Vss or some other low voltage source). To prevent unreliable operation, a continuously gated NMOS transistor 330 is provided in series between node 321 and the NMOS transistor 332. The signal at the gate of transistor 330 can be at a voltage Vccp (as shown in FIG. 3C), at Vcc, or at some other appropriate voltage to keep transistor 330 ON. Continuously gated NMOS transistor 330 provides more reliability to the RF driver circuit 310 by providing a resistive path for the leakage current going through NMOS transistor 332 to create a voltage drop in the leakage current path when the NMOS transistor 332 is OFF.

After a predetermined time period (e.g., at time t1 see FIG. 3B.), the timing signal RMSMWP can be set at a low state, which sets the output of NAND gate circuit 312 and thus the RFF signal at a high state. With the RFF signal at the high state, the ARMW signal is isolated from the global word line GR. With the RFF signal at a high state PMOS transistor 320 is off to isolate the node 321 from the voltage source V1 and the NMOS transistor 326 is turned on.

In some embodiments, when row hammer stress mitigation is desired, the RMSXDP signal remains high for a predetermined period (e.g., from time t1 to t2, see FIG. 3B) to allow for a "soft landing" for the RF voltage and thus the global word line voltage GR. As discussed below, a "soft landing" on the global word line GR also means a "soft landing" on the local word line WL to mitigate the row hammer stress between adjacent local word lines WL in a memory bank MB. To mitigate the row hammer stress, the global word line GR is stepped down to an intermediate voltage Voff prior to entering the pre-charge or standby state. This is accomplished by having the global word line GR follow the RF signal for a predetermined time period (e.g., between t1 and t2, see FIG. 3B). For example, with the RMSXDP and RFX_n signals in the high state, the output of AND gate circuit 314 remains at a high state to keep NMOS transistor 322 ON. With NMOS transistors 322, 324, and 326 all ON, the node 321 and thus the RF signal is pulled down to the voltage Voff, which can be, for example, 0.5 volts. The predetermined period that the RMSXDP signal remains high after the RMSMWP signal is set at a low state can correspond to the time period between t1 and t2. In some embodiments, when no row hammer stress mitigation is desired, the RMSXDP signal can be set to a low state at the same time the RMSMWP signal is set at a low state. When the RMSXDP signal is set to a low state, the output of AND gate circuit 314 is set low to isolate the node 321 from the voltage Voff. In addition, the output of NAND gate circuit 316 is set high to turn ON NMOS transistor 332 to pull down the node 321 to the voltage Vnw1 (or e.g., Vss or some other low voltage source). As discussed above, the RFF and RF signals generated by the RF driver 310 in coordination with the ARMW and ARMWF signals can be used by MWD 300 to set the global word line voltage.

Figure 3D:
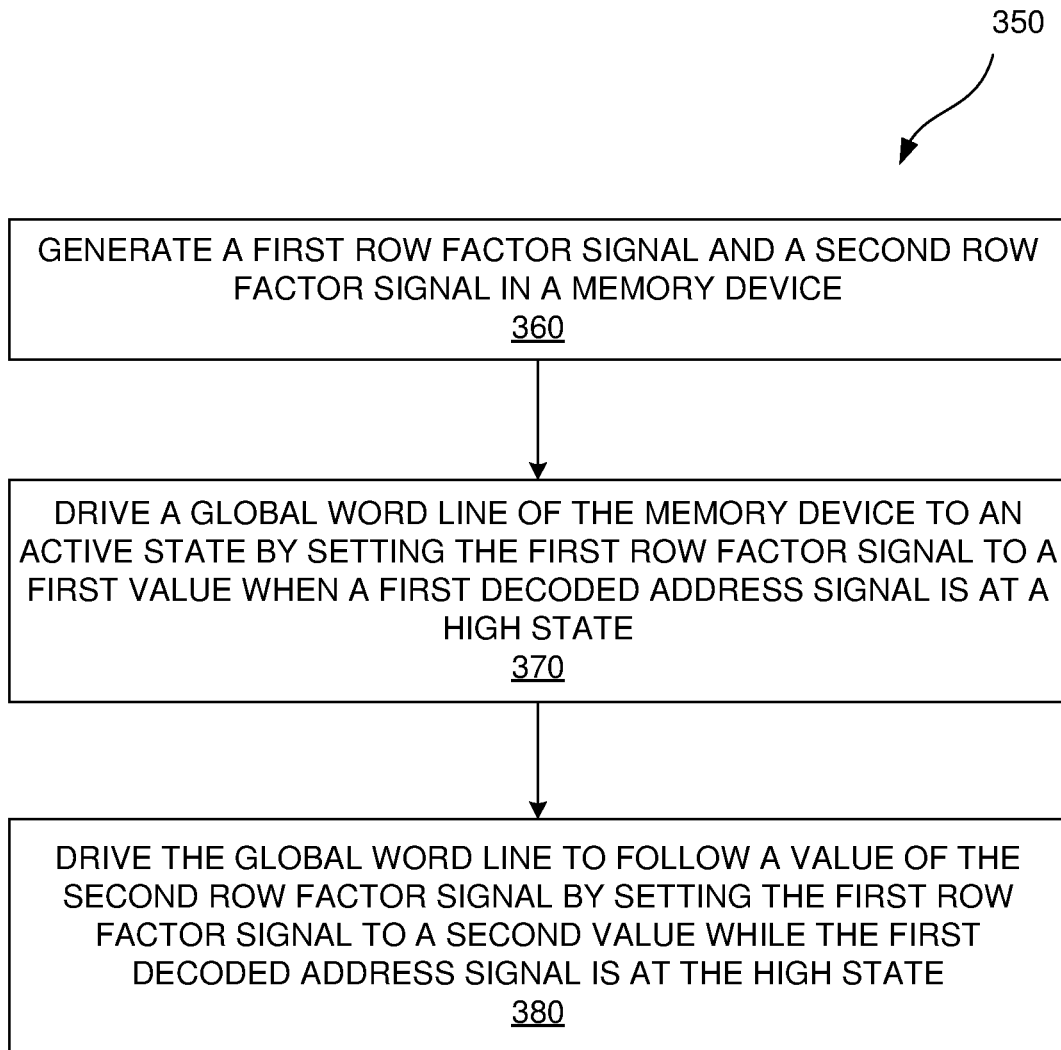
FIG. 3D is flow diagram for managing operation of a main word line driver in accordance with the present disclosure.

FIG. 3D is a flow diagram illustrating example method 350 for managing the operation of the MWDs. The method 350 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 350 is performed by the processor 116 and/or another processer or processors that are external and/or internal to memory device 100. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 360, the processing device (e.g., processor 116 and/or another processor) generates a first row factor signal and a second row factor signal in a memory device. In some embodiments, as discussed above, the first row factor signal can be the RFF signal and the second row factor signal can be the RF signal which are generated by a RF driver circuit (e.g., RF driver circuit 310). At block 370, the processing device (e.g., processor 116 and/or another processor) drives a global word line of the memory device to an active state by setting the first row factor signal to a first value when a first decoded address signal is at a high state. For example, the global word line can be local word line GR (e.g., GR0 to GRn) that is generated by a MWD. In some embodiments, for example as seen in FIGS. 3A and 3B, the global word line GR can go to an active or high state if the decoded address signal ARMW is at a high state (e.g., Vccp) and the pull-up transistor 312 is ON due to the RFF signal being at a low state. At block 380, the processing device (e.g., processor 116 and/or another processor) drives the global word line to follow a value of the second row factor signal by setting the first row factor signal to a second state while the first decoded address signal is at the high state. For example, in some embodiments as seen in FIGS. 3A and 3B, the global word line GR goes to an intermediate value Voff of the RF signal. This scenario occurs when the decoded address signal is at the high state (e.g., Vccp), which turns ON transistor 306, and the RFF row factor signal is at a high state (e.g. Vccp), which turns ON transistor 308 and turns OFF transistor 302. The intermediate voltage corresponds to the row hammer stress mitigation state, as discussed above.

Figure 4A:
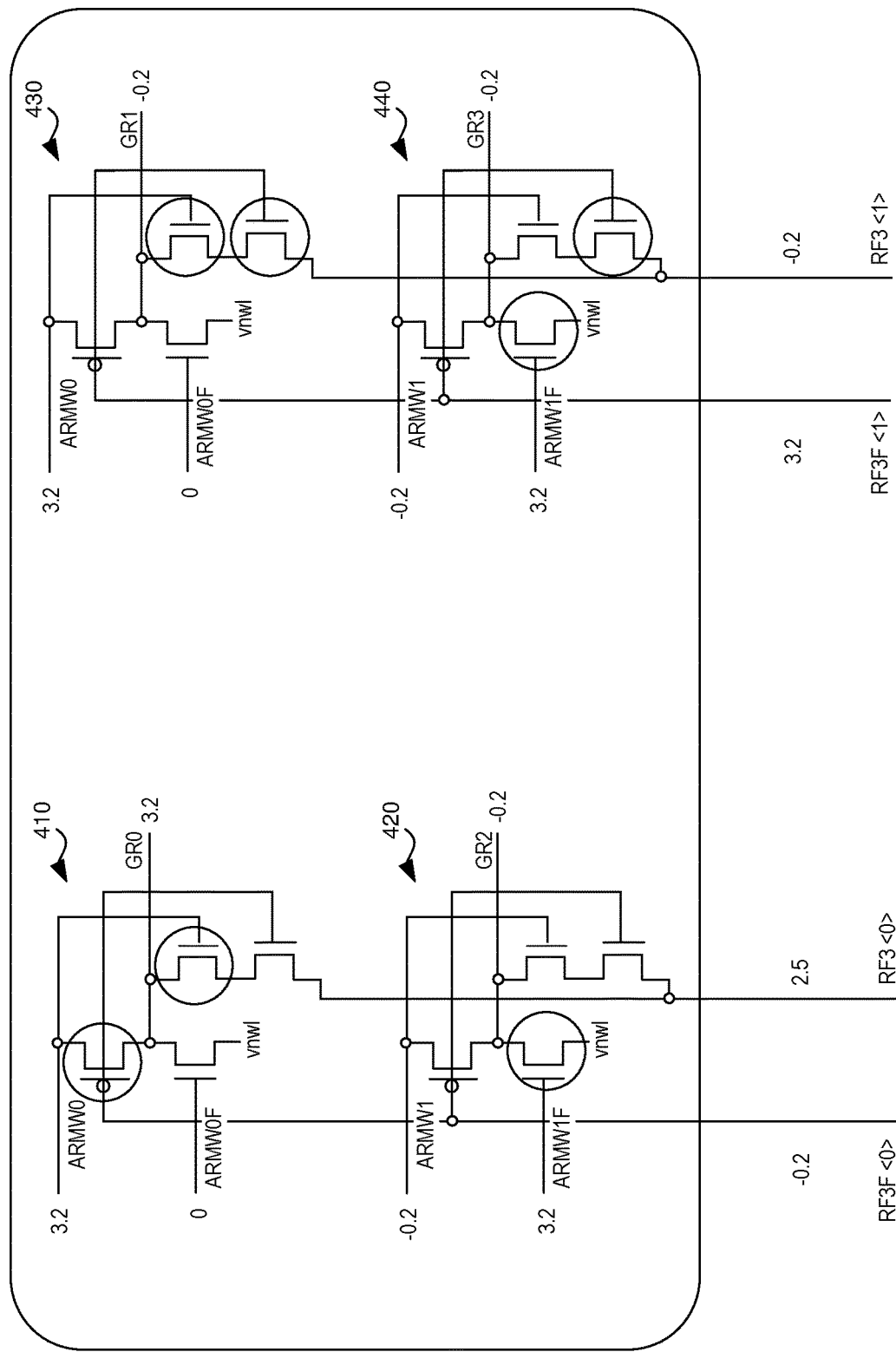
FIG. 4A is a schematic of an embodiment of an array of main word line drivers in accordance with the present disclosure.

FIG. 4A illustrates an exemplary arrangement of a portion of an MWD array in a memory bank MB. For simplicity, FIG. 4A illustrates only four global word lines GR0, GR1, GR2, and GR3 and the respective MWDs 410, 420, 430, and 440. Of course, a memory bank MB can have more than four global word lines, including their corresponding MWDs, and those skilled in the art would understand how to apply the present disclosure to any desired number of MWDs. In addition, because those skilled in the art understand that the configuration and operation of the MWDs 410, 420, 430, and 440 are similar to that of MWD 300, the configuration and operation will not be repeated. As shown in FIG. 4A, the state of each MWD is determined by two sets of decoded row address signals ARMWn/ARMWnF and two sets of decoded row address signals RFm<n>/RFmF<n>. The processor 116 (and/or another processor) can control the two sets of decoded row address signals ARMWn/ARMWnF and two sets of decoded row address signals RFm<n>/RFmF<n> to operate the MWDs 410-440. The ARMWn signal and its complement ARMWnF signal can be received by one or more MWDs and n identifies the group of MWDs that receive the same ARMW and ARMWF signals. The memory bank MB can have one or more groups n (e.g., for a memory bank having 16 groups that are designated by n0 to n15). For brevity and clarity, in the exemplary embodiment of FIG. 4A, the number of groups n is two, designated 0 and 1, and the number of MWDs in each group is two. For example, in the embodiment of FIG. 4A, the decoded row address signals ARMW0/ARMW0F are received by MWDs 410 and 430, and the decoded row address signals ARMW1/ARMW1F are received by MWDs 420 and 440. Similarly, the RFmF<x> signal and its complement RFm<x> signal can be received by one or more MWDs where x identifies the group of MWDs that receive the same RFF and RF signals. For example, in the example of FIG. 4A, the decoded row address signals RFmF<0>/RFm<0> are received by MWDs 410 and 420, and the decoded row address signals RFmF<1>/RFm<1> are received by MWDs 430 and 440. The m can correspond to the memory bank, which is identified as 3 in the exemplary embodiment of FIG. 4A. The combination of the ARMWn/ARMWnF signals and the RFm<x>/RFmF<x> signals selects the appropriate state (active or high state or pre-charge or standby state) for each MWD in memory bank MB. For example, in the exemplary embodiment of FIG. 4A, the signals ARMW0 and ARMW1F are set at a high state (e.g., both at 3.2 volts), and ARMW1 and ARMW0F are set at a low state (e.g., −0.2 volts and 0 volts, respectively). In addition, the RF3<0> and RF3F<1> signals are set at a high state (e.g., 2.5 volts and 3.2 volts respectively), and RF3F<0> and RF3<1> are set at a low state (e.g., both at −0.2 volts). As seen in FIG. 4A, the circles around transistors indicate which transistors are ON to allow the source voltage to pass through. The resulting global word line signal values for GR0, GR1, GR2, and GR3 are 3.2 volts (active or high state), −0.2 volts (pre-charge or stand-by state), −0.2 volts (pre-charge or stand-by state), and −0.2 volts (pre-charge or stand-by state), respectively. The global word line signals (e.g., the signals on global word lines GR0 to GR3) can then be sent to respective SWDs, which drive memory cells based on decoded row address signals as discussed below. Table 2 provides a logic table illustrating the state (A—active state, P—pre-charge state, I—Intermediate voltage (e.g., row hammer stress mitigation) state) of the global word lines GR0-GR3 for the respective MWDs 410 to 440.

Figure 4B:
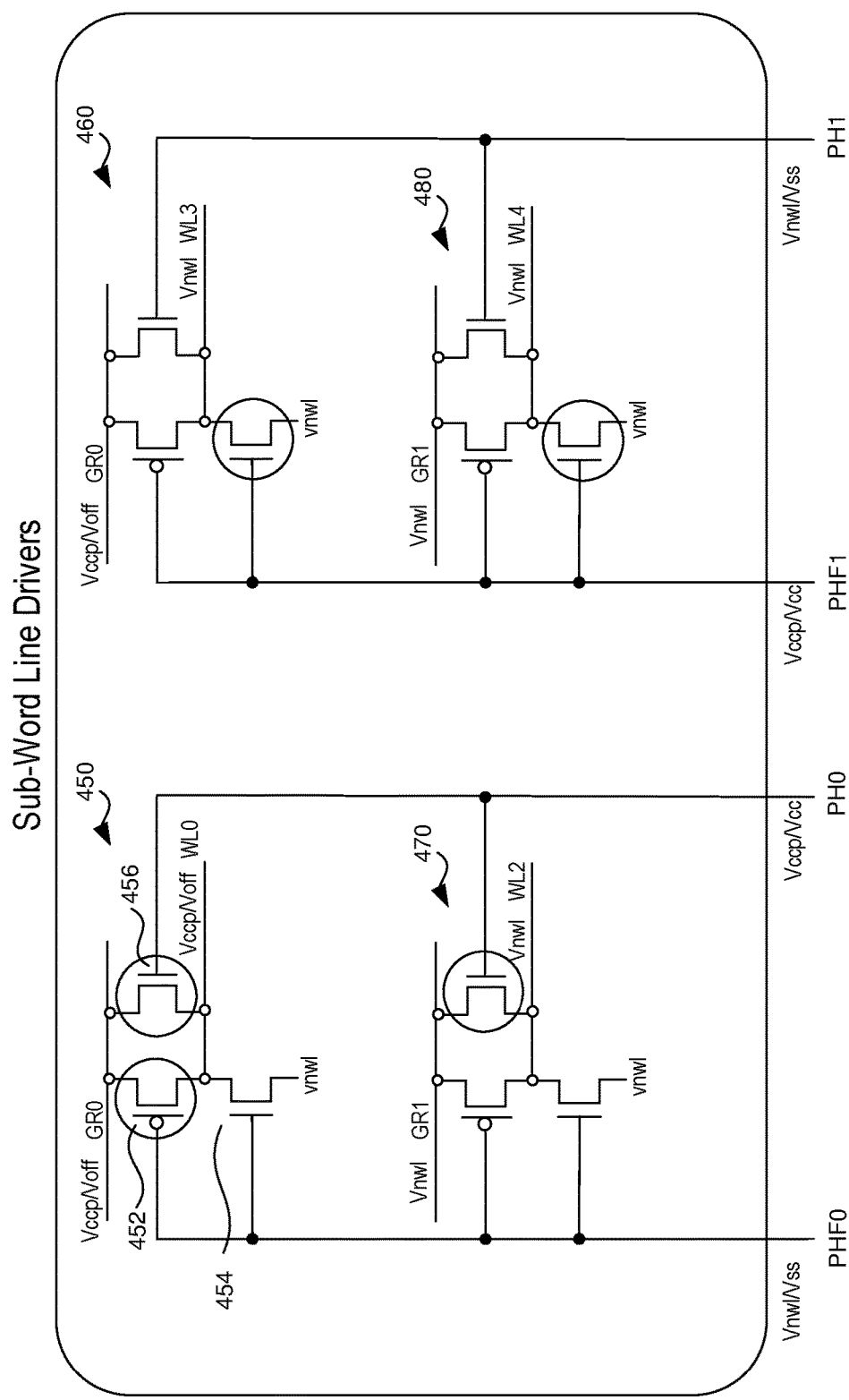
FIG. 4B is a schematic of an embodiment of an array of sub-word line drivers in accordance with the present disclosure.

SWD 450 can include a pull-up circuit having a PMOS transistor 452 that turns ON when the PHF phase signal connected to the gate of the PMOS transistor 452 is low (e.g., at Vnw1, Vss, or another low value). The SWD 450 can also include a NMOS transistor 456 that is placed in parallel with the PMOS transistor 452. The NMOS transistor 456 can act as a pull-up or pull-down circuit based on the voltage on the global word line GR0 and is turned ON when the PH phase signal connected to the gate of the NMOS transistor 456 is high (e.g., Vccp, Vcc, or another high voltage value). The SWD 450 can also include a pull-down circuit having a NMOS transistor 454 and is turned ON when the PHF phase signal connected to the gate of the NMOS transistor 454 is high (e.g., Vccp, Vcc, or another high voltage value). The sources of transistors 452 and 456 can be connected to the global word line GR0, and the drains of the transistors 452 and 456 can be connected to a drain of the transistor 454. The interconnected drains of the transistors 452, 456 and 454 are coupled to a local word line WL0. The source of transistor 454 can be connected to a low voltage source that is in a range of −0.2 volts to 0 volts. For example, the source of transistor 454 can be Vnw1 as shown in FIG. 4B. In some embodiments, the low voltage source can be Vss or some other low voltage source.

As shown in FIG. 4B, the selection of the SWD and thus the local word line WL for accessing the appropriate memory cell is determined by the PHn/PHFn signals (also referred to herein as phase signals) corresponding to decoded row address signals, where n is 0 or 1 in the exemplary embodiment of FIG. 4B. The PHn and PHFn phase signals can be connected to one or more SWDs. For example, in FIG. 4B, each set of phase signals (e.g., PH0/PHF0 and PH1/PHF1) are shown connected to two SWDs (e.g., 450/470 and 460/480, respectively). However, the set of phase signals can be connected to more than two SWDs. For example, in some embodiments, each set of PH/PHF signals can connect to an SWD in each section SECT of a predetermined number of sections in sections SECT0 to

TABLE 2

| ARMW0 | ARMW0F | ARMW1 | ARMW1F | RF3F<0> | RF3<0> | RF3F<1> | RF3<1> | GR0 | GR1 | GR2 | GR3 |
|---|---|---|---|---|---|---|---|---|---|---|---|
| H | L | L | H | L | H | H | L | A | P | P | P |
| H | L | L | H | H | I | H | L | I | P | P | P |
| H | L | L | H | H | L | L | H | P | A | P | P |
| H | L | L | H | H | L | H | I | P | I | P | P |
| L | H | H | L | L | H | H | L | P | P | A | P |
| L | H | H | L | H | I | H | L | P | P | I | P |
| L | H | H | L | H | L | L | H | P | P | P | A |
| L | H | H | L | H | L | H | I | P | P | P | I |

As discussed above, each of the global word lines (e.g., GR0 to GR3) connects to SWDs in order to quickly drive the signal levels on the respective word lines. FIG. 4B illustrates exemplary embodiment of a SWD array arrangement corresponding to global word lines GR0 and GR1. For clarity, only two sets of SWDs are shown for each global word line GR. For example, SWDs 450 and 460 are connected to global word line GR0, and SWDs 470 and 480 are connected to global word line GR1. However, more than two SWDs can be connected to each global word line GR such as, for example eight SWDs, sixteen SWDs or more. Each of the SWDs 450, 460, 470, and 480 output a local word line WR0, WR1, WR2, and WR3, respectively. As seen in FIG. 4B, the configuration of each of the SWDs 450, 460, 470, and 480 can be the same. Accordingly, for brevity, only the configuration and operation of SWD 450 will be discussed.

SECTn (see FIG. 2). For example, the predetermined number of sections can be seven sections, and the set of PH/PHF signals can be connected to a SWD in each of the seven sections. However, in other exemplary embodiments, the predetermined number can be more than seven sections or less than seven sections. In some conventional SWDs the global word line signals are used in switching the transistors in the SWD (e.g., the complement of the GR0 signal can be connected to the gate of the pull-up PMOS transistor in some conventional transistor and the PH phase signal can be connected to the source of the pull-up PMOS transistor). However, by using the PH and PHF phase signals to switch the transistor gates of a SWD and connecting the set of PH/PHF phase signals to an SWD in one or more sections SECT0 to SECTn, the layout area on the memory device 100 needed for the phase drives can be reduced.

As seen in FIG. 4B, the global word line GR0 signal is provided by the MWD (e.g., MWD 410) as discussed above. The PH0 and PHF0 phase signals can be set to appropriate states by a phase driver, which is known to those skilled in the art, to place the SWD 450 in the active state, intermediate voltage state, and the pre-charge state. For example, as seen in FIG. 4B, the PH0 phase signal can be set at a high state having a value of Vccp, which can be in a range of 3.0 volts to 3.5 volts. In some embodiments, the value of Vccp can be in a range of 3.2 volts. In some embodiments, the high state can be Vcc. The PHF0 phase signal can be set at a low state having a value of, for example, Vnw1 (or e.g., Vss or another low voltage value). With PH0 at a high state, SWD 450 is selected to be in an active state to receive and follow the value of the global word line GR0, and the memory cells attached WL0 can be accessed for memory operations (e.g., read, write, etc.) based on the value of the global word line GR0. As discussed above, in some embodiments, the MWD will set the global word line GR to an intermediate voltage state when transitioning from the active state to the pre-charge state. For example, as seen in FIG. 4B, the global word line GR0 can have a value of Vccp for the active state and a value of Voff for the intermediate state. With PHF0 low and PH0 high, the SWD 450 will set the local word line WL0 to follow the voltage on the global word line GR0, including the intermediate voltage stage (e.g., having a voltage Voff) during the transition from the active stage (e.g., Vccp, Vcc) to the pre-charge state (e.g., Vnw1, Vss). With the global word line at a low state, the PHF1 phase signal at a high state, and the PH1 phase signal at a low state, the other SWDs 460, 470, 480 can be in a pre-charge state (e.g., Vnw1, Vss). As seen in FIG. 4B, the circles around transistors indicate which transistors are ON to allow the source voltage to pass through in the respective SWDs.

Figure 5A:
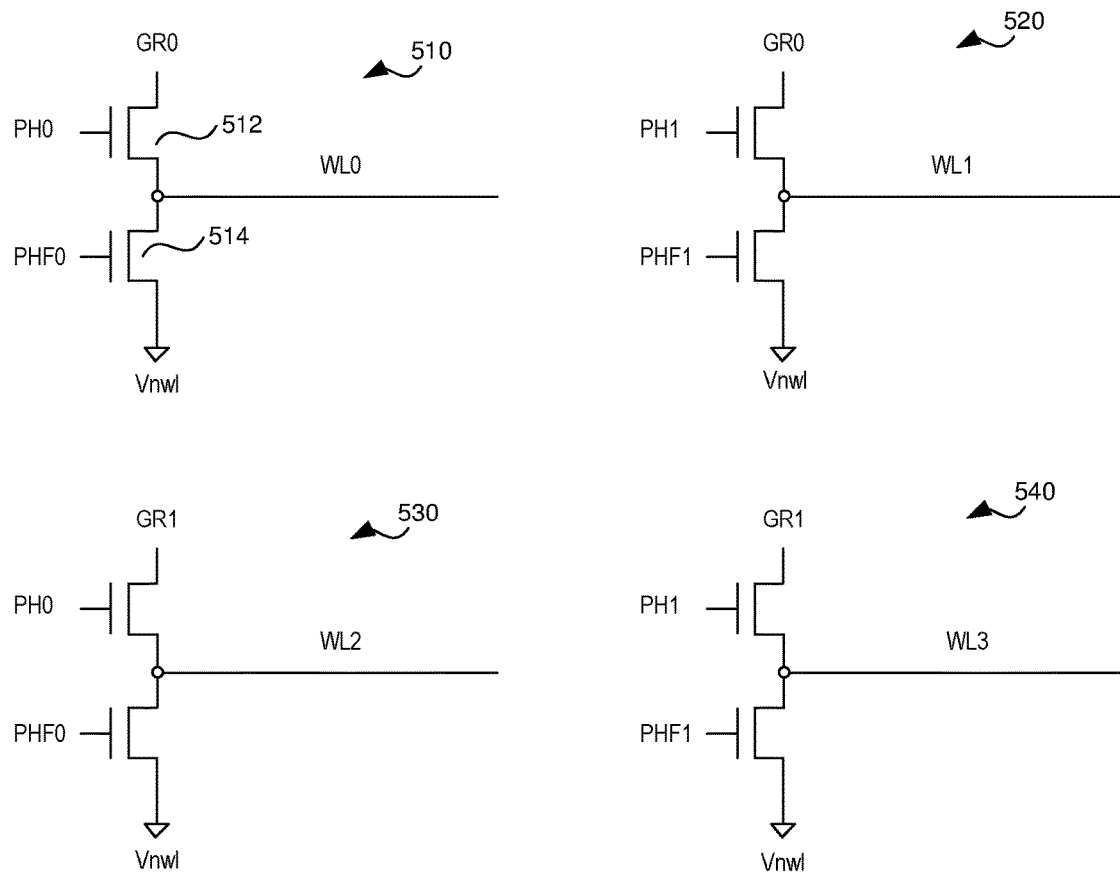
FIG. 5A is a schematic of another embodiment of an array of sub-word line drivers in accordance with the present disclosure.

FIG. 5A illustrates another exemplary embodiment of a SWD array arrangement corresponding to global word lines GR0 and GR1. For clarity, only two sets of SWDs are shown for each global word line GR. For example, SWDs 510 and 520 are connected to global word line GR0, and SWDs 530 and 540 are connected to global word line GR1. However, more than two SWDs can be connected to each global word line GR. Each of the SWDs 510, 520, 530, and 540 output a local word line WL0, WL1, WL2, and WL3, respectively. As seen in FIG. 5A, the configuration of each of the SWDs 510, 520, 530, and 540 can be the same. In some embodiments, each SWD can exclusively use NMOS transistors for driving the local word line WL. That is the SWD is an NMOS-only SWD. For example, SWD 510 can include an NMOS transistors 512, which acts as pull-up circuit, and an NMOS transistors 514, which acts as a pull-down circuit. The drain of the transistor 512 can be connected to a drain of the transistor 514. The interconnected drains of the transistors 512, 514 are coupled to a local word line WL0. The source of transistor 512 can be connected to the corresponding global word line GR0, and the source of transistor 514 can be connected to a low voltage source that is in a range of −0.2 volts to 0 volts. For example, the source of transistor 514 can be Vnw1 as shown in FIG. 5A. In some embodiments, the low voltage source can be Vss or some other low voltage source. As shown in FIG. 5A, the selection of the SWD and thus the word line WL for accessing the appropriate memory cell is determined by the PHn/PHFn signals corresponding to decoded row address signals, where n is 0 or 1 in the exemplary embodiment of FIG. 5A. As discussed above, each set of PHn/PHFn phase signals can be connected to a SWD in a predetermined number of sections in sections SECT0 to SECTn.

The timing control of NMOS transistors such as those used in, for example, SWDs 510-540 can create issues related to the stability and reliability of the NMOS transistors. For example, the stability and reliability and reliability of the NMOS transistors can be affected if the NMOS transistors are switched when there is a high source to drain voltage (Vsd) or drain to source voltage (Vds). In exemplary embodiments, of the present disclosure, the timing operation of one or more of the NMOS transistors in the SWD and/or the signals to the SWD are controlled so that switching occurs at a minimum or reduced Vds or Vsd magnitude.

Figure 5B:
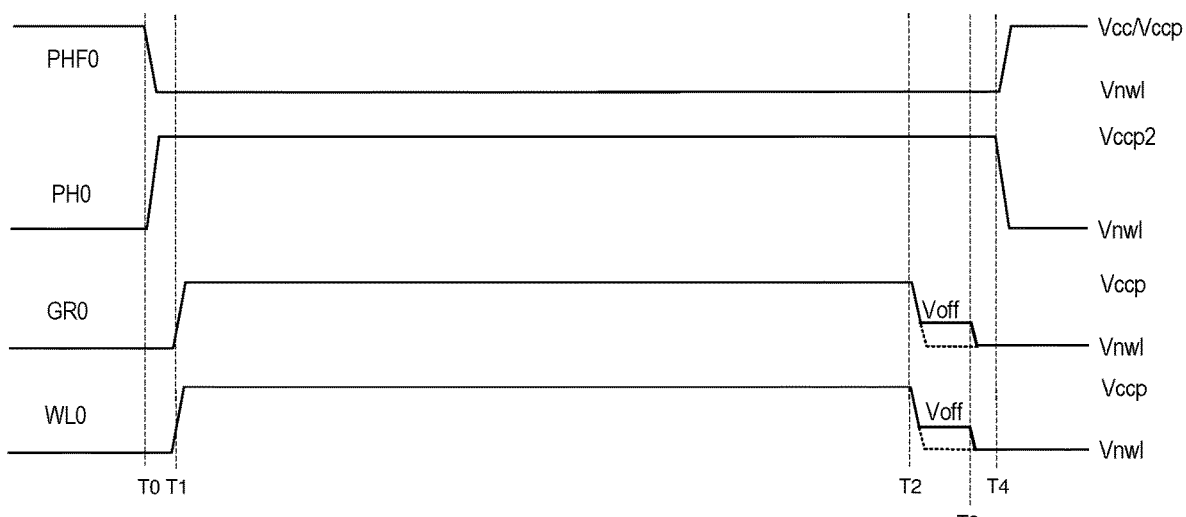
FIG. 5B is a signal timing diagram of a sub-word line driver of FIG. 5A.

FIG. 5B illustrates a timing diagram that provides stability and reliability for the operation of the NMOS-only SWDs of FIG. 5A. For brevity, only the timing for SWD 510 is shown, but those skilled in the art understand that the timing diagram for the other SWDs will be similar. The global word line GR0 signal is provided by the MWD (e.g., MWD 410) as discussed above. For example, the value of global word line GR0 can be at Vccp (or another high voltage level), at Voff (or another intermediate voltage level), or at Vnw1 (or another low voltage level). Prior to time T0, the PH0 phase signal can be set at a high state having a value of Vccp2, which can be in a range of 3.8 volts to 4.7 volts. In some embodiments, the value of Vccp2 can be in a range of 4.2 volts to 4.5 volts, such as, for example, 4.2 volts or 4.5 volts. The PHF0 phase signal can be set at a low state having a value of, for example, Vnw1 (or e.g., Vss or another low voltage value). The PH0 and PHF0 phase signals can be set to their respective states by an FX phase driver, see FIG. 6, discussed below. With PH0 at a high state, SWD 510 is selected to be in an active state to receive and follow the value of the global word line GR0, and the memory cells attached WL0 can be accessed for memory operations (e.g., read, write, etc.) based on the value of the global word line GR0. The other SWDs 520, 530, 540 can be in a pre-charge state.

Operation of the SWD 510 is provided with reference to FIGS. 5A and 5B. At time T0, the processor 116 (and/or another processor) can control the input signals to a FX phase driver (e.g., FXD 600 discussed below) to set the PH0 phase signal to a high state (e.g., Vccp2) and the PHF0 to a low state (e.g., Vnw1). As seen in FIG. 5B, the setting of the PH0 signal to the high state occurs when the global word line is at the pre-charge state such that Vds/Vsd at the time PH0 is at a minimum magnitude, which improves the reliability of SWD 510. After transistor 512 is ON due to PH0 going to the high state, at time T1, the processor 116 (and/or another processor) can control the input signals to MWD (e.g., MWD 300, 410-440, discussed above) to set the value of the global word line GR0 to the active or high state. In some embodiments, the value of the global word line GR is Vccp, which can be, for example, 3.2 volts. With the PHF0 phase signal at the low state, the NMOS transistor 514 is OFF and the local word line WL0 is isolated from the voltage source Vnw1 (or, e.g., Vss or another low voltage source). With the PH0 phase signal at the high state, the NMOS transistor 512 pulls up the local word line WL0 to the value Vccp (or another appropriate high state value) of the global word line GR0. In some embodiments, the high state value of the PH0 phase signal is higher than the active state value of the global word line GR0 by at least the threshold voltage of the NMOS transistor 512. For example, if the value of global word line GR0 is 3.2 volts and the threshold value of transistor 512 is 0.6 volts, the PH0 phase signal can be set at a value that 3.8 volts or greater. For example, the PH0 phase signal can be set at a value of Vccp2, which can be in a range of 3.8 volts to 4.7 volts. In some embodiments, the value of Vccp2 can be in a range of 4.2 volts to 4.5 volts, such as, for example, 4.2 volts or 4.5 volts. By setting the value of the PH0 phase signal at or higher than the value of the global word line GR0 plus the threshold voltage of transistor 512 (e.g., Vccp+Vt), the value of the local word line WL0 can be pulled up to the full voltage of the GR0 signal. In some embodiments, the PH0 voltage value is higher than the value of the global word line GR0 plus the threshold voltage of transistor 512 (e.g., greater than Vccp+Vt). That is, the voltage of PH0 is set higher than that the minimum needed for ensuring that the local word line WL0 is at the full voltage of the global word line GR0. However, a higher than minimum required voltage (e.g., greater than Vccp+Vt) can mean that the pull-up transistor in the NMOS-only SWD is less reliable.

Turning to FIG. 5B, at time T2, the processor 116 (and/or another processor) can control the input signals to MWD (e.g., MWD 300, 410-440, discussed above) to start the transition of the global word line GR0 signal from the active or high state to a pre-charge or standby state (time T2 can correspond to time t1 in FIG. 3B). In some embodiments, if row hammer stress mitigation is desired, the value of global word line GR0 signal is set to an intermediate voltage Voff as discussed above. Because the NMOS transistor 512 is still ON at this time, the value of the local word line WL0 signal will follow the global word line GR0 signal and the local word line WL0 signal will be set to the intermediate voltage Voff. The voltage Voff is maintained for a predetermined time period T2 to T3, which can correspond to the time period t1 to t2 in FIG. 3B, before dropping to the pre-charge or standby state. By performing a "soft landing" from the active or high state to the pre-charge or standby state on the local word line WL, row hammer stress on one or more of the adjacent local word lines (e.g., WL1 to WL3) on the memory bank MB is mitigated. In some embodiments, if row hammer stress mitigation is not desired, at time T2, the processor 116 (and/or another processor) can control the input signals to MWD (e.g., MWD 300, 410-440, discussed above) to set the global word line GR0 to the pre-charge state (see dotted line) having a value Vnw1 (or e.g., Vss or some other low voltage value) and the local word line WL0 will follow the global word line GR0 (see dotted line).

After the global word line GR0 has reached the pre-charge state, at time T4, the processor 116 (and/or another processor) can control the input signals to a FX phase driver (e.g., FXD 600 discussed below) to set the PH0 phase signal to a low state having a value Vnw1 (or e.g., Vss or some other low voltage value). At this time, the processor 116 (and/or another processor) can control the input signals to a FX phase driver (e.g., FXD 600 discussed below) to set the PHF0 phase signal to a high state having a value Vcc (e.g., 2.5 volts) or Vccp (e.g., 3.2 volts). In some embodiments, the setting of the PHF0 phase signal to the high state can be delayed such that both the PH0 and PHF0 phase signals are at a low value, which means that NMOS transistors 512 and 514 are both off and the local word line WL0 is isolated from both the high and low voltage sources. However, any delay in setting the PHF0 to the high state after the PH0 is set to the low state should be limited since the local word line WL0 will be at a float value. With the PHF0 phase signal at the high state, the transistor 514 is turned on and the value of the local word line WL0 is pulled down to the value of the low voltage source Vnw1 (or, e.g., Vss or some other low voltage source). The exemplary timing diagram as shown in FIG. 5B for the PH0 and PHF0 phase signals improves the reliability of the NMOS transistor and thus NMOS-only SWD by ensuring that the NMOS transistors are switched at minimal or reduced Vds/Vsd magnitudes.

As discussed above, in some sub-word line drivers (e.g., see FIG. 4B), a PMOS transistor is included in each of the SWDs. The PMOS transistor allows for the word line WL to reach the full high voltage of the global word line GR. For example, if a global word line (e.g., GR0, GR1, GR2, or GR3) is at 3.2 volts, the corresponding local word line (e.g., WL0, WL1, WL2, or WL3) can be pulled up the full 3.2 volts by a PMOS transistor. However, PMOS transistors can require an n-well in a p-well from which the memory cell arrays are formed, thereby causing the layout area for the SWD to be larger. Due the large number of global word lines in a typical memory device, an NMOS-only SWD such as that shown in FIG. 5A reduces the amount of space needed for the SWDs by avoiding the need for an n-well for each of the SWDs, which reduces the area needed by the SWDs on a semiconductor substrate. However, by going to a NMOS-only SWD, full voltage at the local word line (e.g., WL0, WL1, WL2, WL3) may not be achieved unless the gate voltage necessary to couple the voltage from the global word line (e.g., GR0, GR1, GR2, GR3) to the respective local word line (e.g., WL0, WL1, WL2, WL3) is increased by at least the threshold voltage of the NMOS transistors. For example, the embodiment in FIG. 5A, as discussed above, a gate voltage of Vccp2 (e.g., 4.2 volts, 4.5 volts) is applied by the PH0 phase signal instead of a gate voltage of Vccp (e.g., 3.2 volts) used in conventional circuits. Thus, the voltage of the PHn phase signals applied to the gates of the pull-up NMOS transistors in NMOS-only SWDs can be at a higher voltage (e.g., Vccp2) than that (e.g., Vcc, Vccp, etc.) used for the pull-up PMOS transistors in conventional SWDs. In some embodiments, Vccp2 can be in a range of 3.8 volts to 4.7 volts. In some embodiments, the value of Vccp2 can be in a range of 4.2 volts to 4.5 volts, such as, for example, 4.2 volts or 4.5 volts. Conventional FX phase drivers are not able to provide such high PH phase signal voltages without experiencing stability and reliability issues.

Figure 6:
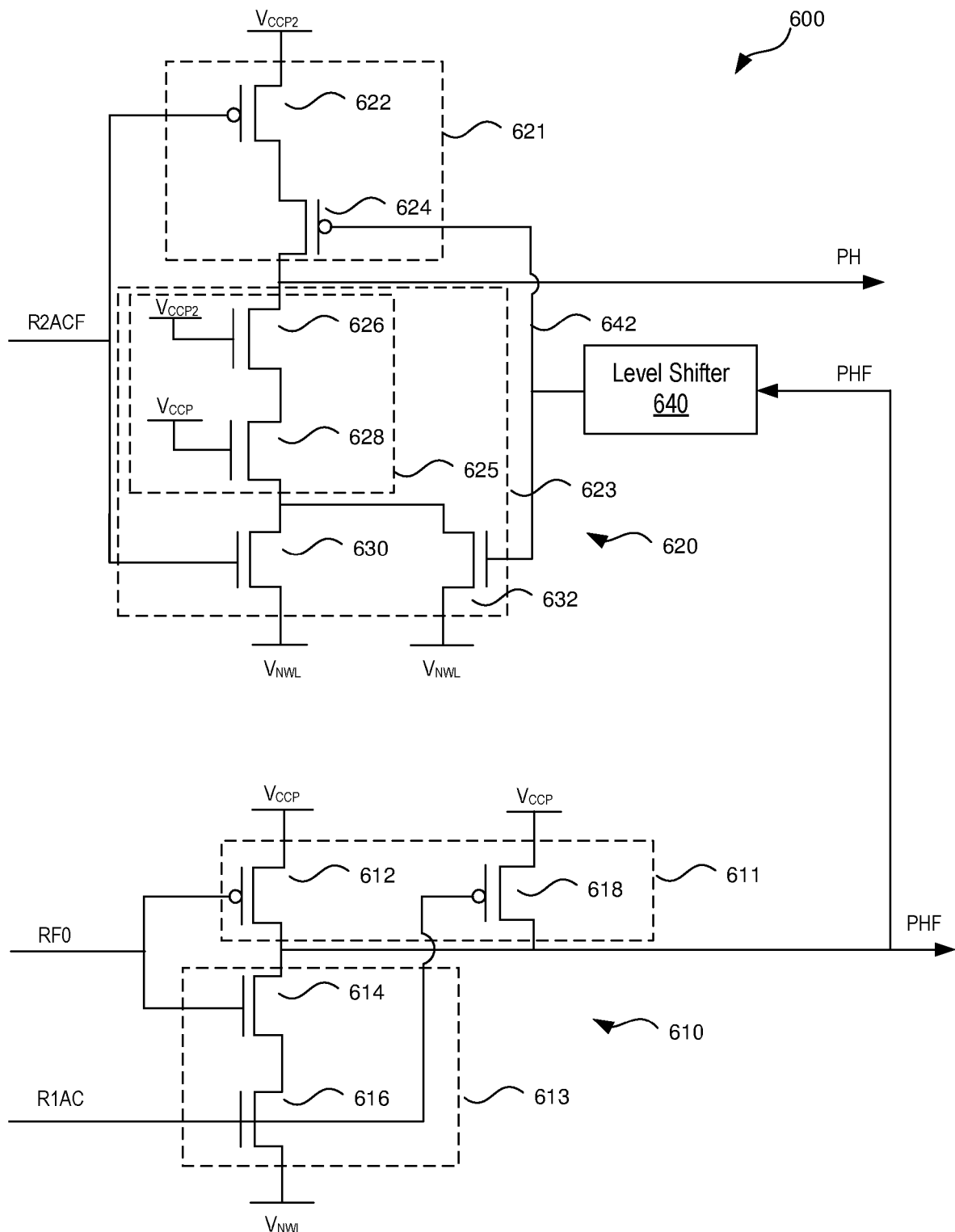
FIG. 6 is a schematic of an embodiment of a FX phase driver in accordance with the present disclosure.

In exemplary embodiments of the present disclosure, FX phase drivers that provide the PHn and PHFn phase signals are configured to reliably provide signal voltages that range from Vnw1 to Vccp2 (e.g., −0.2 volts to 4.7 volts). As seen in FIG. 6, FX driver 600 receives decoded row address signal RF0 and timing control signals R1AC and R2ACF. The processor 116 (and/or another processor) can control the decoded row address signal RF0 and/or the timing control signals R1AC and R2ACF to operate the FX phase driver 600. The circuits (not shown) to generate the timing control signals and the decoded row address signals for FX drivers are known in the art and thus, for brevity, will not be discussed further. As seen in FIG. 6, the FXD 600 includes a phase circuit 610 for generating a PHF phase signal and a phase circuit 620 for generating a PH phase signal that is generally the complement of the PHF phase signal. The phase circuit 610 includes a pull-up circuit 611 and a pull-down circuit 613. In some embodiments, the pull-up circuit 611 can include a transistor 612 and a transistor 618 that are connected in parallel. In some embodiments, the pull-down circuit 613 can include a transistor 614 and a transistor 616 that are connected in series. The transistor 612, which can be, for example, a PMOS transistor, can have a drain coupled to the drain of a transistor 614, which can be, for example, a NMOS transistor. The source of transistor 612 is coupled to a voltage source, such as, for example, Vccp (or, e.g., Vcc or another high voltage source), and the source of transistor 614 is connected to the drain of transistor 616, which can be a NMOS transistor. The source of transistor 616 is coupled to a voltage source, such as, for example, Vnw1 (or, e.g., Vss or another low voltage source). As seen in FIG. 6, the interconnected drains of transistors 612 and 614 are coupled to a PHF signal line. In addition, transistor 618, which can be, for example, a PMOS transistor, is connected in parallel with transistor 612. Thus, the source of transistor 618 can be connected to the same voltage source as that of transistor 612, such as, for example, Vccp (or, e.g., Vcc or another high voltage source), and the drain of transistor 618 can be connected to the PHF signal line.

As seen in FIG. 6, the gates of the transistors 612 and 614 receive the decoded row address signal RF0 and the gates of transistors 616 and 618 receive the timing control signal R1AC. If the timing signal R1AC has a low value (e.g., 0 volts), the transistor 616 is OFF, which isolates the voltage source Vnw1 (or, e.g., Vss or another low voltage source) from the PHF signal line. In addition, the low value on timing control signal R1AC means that the PMOS transistor 618 is ON. With transistor 618 ON, the PHF signal line is pulled up to the source voltage, which in this case can be Vccp (or, e.g., Vcc or another high voltage source). As seen in FIG. 5A and as discussed above, with a PHF signal that is high, the corresponding SWD is inactive and the SWD's word line has a low value, e.g., Vnw1 (or, e.g., Vss or another low voltage source).

The PHF signal is transmitted to the circuit 620 for generation of the PH phase signal, which as discussed above selects the SWD to activate. The circuit 620 includes a pull-up circuit 621 and a pull-down circuit 623. The pull-up circuit 621 can include a transistor 622 connected in series to a transistor 624. The pull-down circuit 623 can include a stabilization circuit 625 connected in series to transistors 630 and 632, which are connected in parallel. The stabilization circuit 625 can include one or more continuously gated transistors. For example, as seen in FIG. 6, the stabilization circuit 625 includes two continuously gated transistors 626 and 628 that are connected in series.

The transistor 622, which can be a PMOS transistor, can have a drain connected to the source of transistor 624, which can be a PMOS transistor. The source of transistor 622 can be connected to a voltage source such as, for example, Vccp2. In some embodiments, as discussed above, the value of Vccp2 can be higher than the active word line voltage, which can be, for example, Vccp (or, e.g., Vcc or another high voltage source). The drain of transistor 624 can be connected to the drain of transistor 626, which can be a NMOS transistor. As seen in FIG. 6, the interconnected drains of transistors 624 and 626 are coupled to the PH signal line. The source of transistor 626 is coupled to the drain of transistor 628, which can be a NMOS transistor. The source of transistor 628 can be coupled to the drain of transistor 630, which can be a NMOS transistor. The source of transistor 630 is coupled to a voltage source, such as, for example, Vnw1 (or, e.g., Vss or another low voltage source). In addition, transistor 632, which can be, for example, a NMOS transistor, is disposed in parallel with transistor 630. Thus, the source of transistor 632 can be connected to the same voltage source as that of transistor 630, such as, for example, Vnw1 (or, e.g., Vss or another low voltage source), and the drain of transistor 32 can be connected to the source of transistor 628. The circuit 620 can also include a level shifter 640 that receives the PHF signal from circuit 610. In some embodiments, the level shifter 640 shifts the high voltage level of the PHF signal. For example, if the PHF signal from circuit 610 is at Vccp, which can be, for example, 3.2 volts, the level shifter 640 outputs a gate drive signal 642 that is higher in value such as, for example, Vccp2.

As seen in FIG. 6, the gates of transistors 622 and 630 receive the timing control signal R2ACF. When the timing signal R2ACF is high, transistor 622 is OFF to isolate the PH signal line from the high voltage source (e.g., Vccp2) and the transistor 630 is ON to pull down the PH signal line to the value of the low voltage source Vnw1 (or, e.g., Vss or another low voltage source) via the stabilization circuit 625. As discussed above, the stabilization circuit 625 can include two continuously gated transistors 626 and 628 that are connected in series. The continuously gated transistors 626 and 628 are connected between the PH signal line and the drains of transistors 630 and 632. Because transistors 626 and 628 are always ON, the voltage PH signal line is pulled down to Vnw1 (or, e.g., Vss or another low voltage source) when the transistor 630 or the transistor 632 is ON. The gate of transistor 626 can be connected to a high voltage source that can provide a voltage in a range of 1.5 volts to 4.7 volts (e.g., Vccp2, Vccp, Vcc or another high voltage source) and the gate of transistor 628 is connected to a high voltage source that can provide a voltage in a range of 1.5 volts to 4.7 volts (e.g., Vccp2, Vccp, Vcc or another high voltage source). In some embodiments, the gate of transistor 626 is connected to a voltage source that is at a higher voltage than the gate of transistor 628. For example, the gate of transistor 626 can be connected to Vccp2 and the gate of transistor 628 can be connected to Vccp or Vcc. In some embodiments, the gate of transistor 628 is connected to a voltage source that is at a higher voltage (e.g., Vccp2) than the gate of transistor 626 (e.g., Vccp, Vcc). In some embodiments, the gate of transistor 626 is connected to a voltage source that is at a same voltage level as that of the gate of transistor 628. The NMOS transistors 626 and 628 provide more reliability to FXD 600 circuit by providing a resistive path for the leakage current going through transistor 630 and/or transistor 632 to create a voltage drop in the leakage current path when one or both transistors 630 and 632 are OFF.

When the timing signal R2ACF is low, transistor 630 is OFF to isolate the PH signal line from the low voltage source Vnw1 (or, e.g., Vss or another low voltage source), and the transistor 622 is ON to connect the high voltage source (e.g., Vccp2) to the transistor 624. The value of the PH signal line when the timing signal R2ACF is low is based on the output gate drive signal 642, which is received by the gates of transistors 624 and 632. When the PHF signal is high (e.g., Vccp, Vcc, etc.), the transistor 624 is OFF and the transistor 632 is ON. With transistor 632 ON, the voltage of the PH signal line is pulled to the low voltage source Vnw1 (or, e.g., Vss or another low voltage source) because transistors 626 and 628 are ON. When the PHF signal is low (e.g., at Vnw1, at Vss or at another low voltage value), the transistor 632 is OFF and the transistor 624 is ON. With R2ACF low and transistor 622 ON, the PH signal line is pulled up to the high voltage source (e.g., Vccp2). The PH phase signal is output from the FXD 600 to activate a local word line WL of the appropriate SWD or SWDs. Table 3 provides a logic table for the FXD 600 (the "--" indicates that the value H or L of that input signal does not matter to output values.

TABLE 3

| | INPUT | | | OUTPUT | |
|---|---|---|---|---|---|
| | RF0 | R1AC | R2ACF | PHF | PH |
| 1A | L | — | — | H | L |
| 1B | — | L | — | H | L |
| 2 | H | H | L | L | H |
| 3 | H | H | H | L | L |

In some embodiments, rows 1A and 1B in Table 3 can correspond to a time period prior to T0 and after T4 in FIG. 5B. During these periods, the corresponding SWD (e.g., SWD 510, 520, 530, or 540) is in a pre-charge or standby state. Row 2 can correspond to a time period between T0 and T3. During this time period, the corresponding SWD (e.g., SWD 510, 520, 530, or 540) is in an active/intermediate voltage state and, as discussed above, the local word line WL (e.g., WL0, WL1, WL2, or WL3) follows the voltage on the respective global word line GR (e.g., GR0, GR1, GR2, or GR3). Row 3 can correspond to a time when both the PHF and PH signals are low if a delay in setting PHF0 to the high state after PH0 goes to the low state is desired for any reason.

Figure 7:
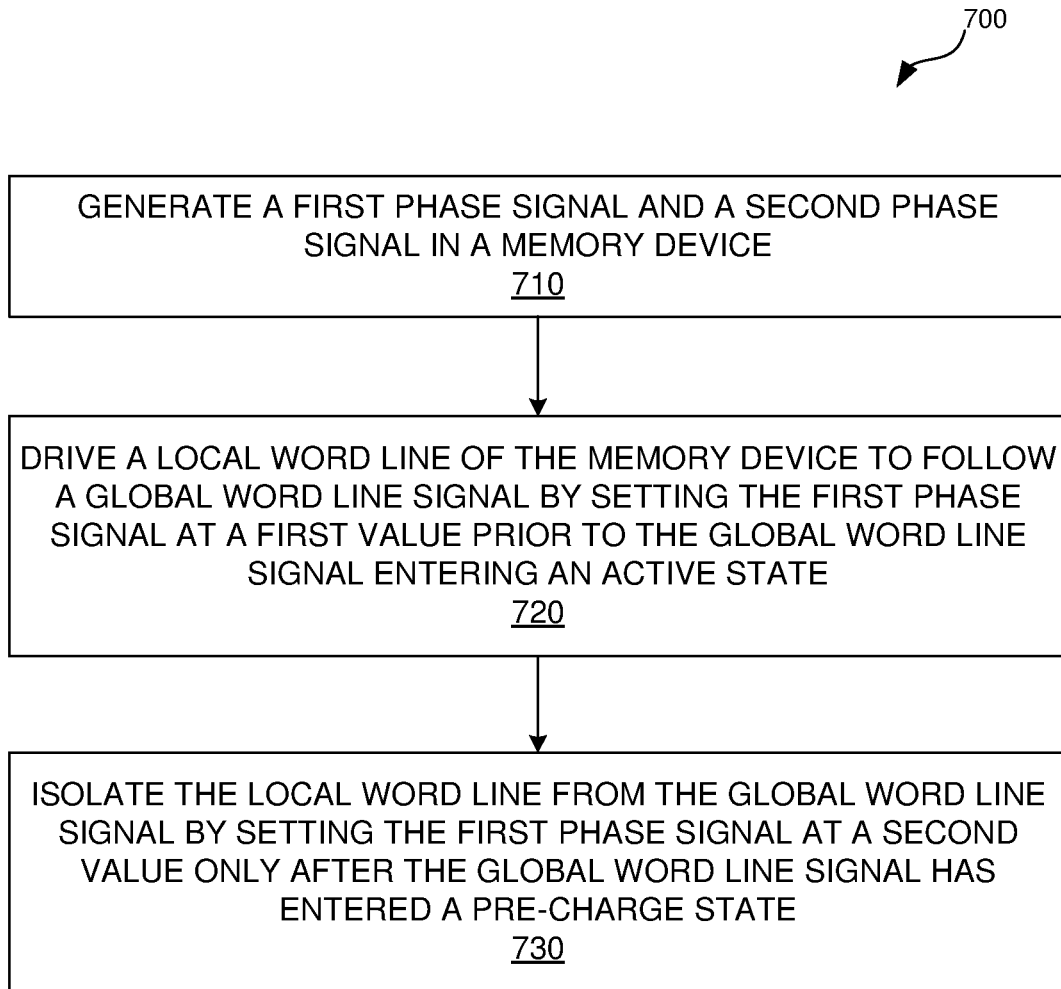
FIG. 7 is flow diagram for managing operation of a sub-word line driver in accordance with the present disclosure.

FIG. 7 is a flow diagram illustrating example method 700 for managing the operation of the SWDs. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the processor 116 and/or another processor or processors that are external and/or internal to memory device 100. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 710, the processing device (e.g., processor 116 and/or another processor) generates a first phase signal and a second phase signal in a memory device. In some embodiments, as discussed above, the first phase signal can be the PH phase signal and the second phase signal can be the PHF phase signal which are generated by a FX phase driver circuit (e.g., FXD 600). At block 720, the processing device (e.g., processor 116 and/or another processor) drives a local word line of the memory device to follow a global word line signal by setting the first phase signal at a first value prior to the global word line signal entering an active state. For example, the local word line can be local word line WL (e.g., WL0 to WLn) that is generated by a SWD and the global word line can be global word line GR (e.g., GR0 to GRn) that is generated by a MWD. A transistor in a SWD (e.g., transistor 512 in SWD 510) can be turned ON so that the local word line WL (e.g., WL0) follows the global word line GR (e.g., GR0), as discussed above. As seen in FIG. 5B, the PH phase signal (e.g., PH0) is set to a high state (e.g., Vccp2) prior to the global word line (e.g., GR0) going to an active state (e.g., Vccp).

At block 730, the processing device (e.g., processor 116 and/or another processor) isolates the local word line from the global word line signal by setting the first phase signal at a second value only after the global word line signal has entered a pre-charge state. For example, the local word line can be local word line WL (e.g., WL0 to WLn) that is generated by a SWD and the global word line can be global word line GR (e.g., GR0 to GRn) that is generated by a MWD. A transistor in a SWD (e.g., transistor 512 in SWD 510) can be turned OFF so that the local word line WL (e.g., WL0) is isolated from the global word line GR (e.g., GR0), as discussed above. As seen in FIG. 5B, the PH phase signal (e.g., PH0) is set to a low state (e.g., Vnw1) only after the global word line (e.g., GR0) goes to a pre-charge state (e.g., Vnw1).

Although the present invention has been described with reference to the disclosed embodiments, persons skilled in the art will recognize that changes may be made in form and detail without departing from the invention. For example, although exemplary embodiments have been explained with respect to NMOS transistors being the only transistors used in the SWD, it will be understood that, in other embodiments, PMOS transistors may be substituted for NMOS embodiments and vice-versa, in which case the memory cells arrays and SWDs may be fabricated in an n-type substrate rather than a p-type substrate. Such modifications are well within the skill of those ordinarily skilled in the art. Accordingly, the invention is not limited except as by the appended claims.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those of ordinary skill in the relevant art will recognize. For example, although steps are presented in a given order, alternative embodiments may perform steps in a different order. The various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising," "including," "having," and "with" are used throughout to mean including at least the recited feature(s) such that any greater number of the same feature and/or additional types of other features are not precluded.

The processing device (e.g., processor 116 and/or another processor/controller) represents one or more general-purpose processing devices such as a microprocessor, a central processing unit, or the like. More particularly, the processing device can be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device (e.g., controller 190, controller 140 and/or another controller) can also be one or more special-purpose processing devices such as an application specific integrated circuit (ASIC), a field programmable gate array (FPGA), a digital signal processor (DSP), network processor, or the like. The processing device (e.g., controller 190, controller 140 and/or another controller) is configured to execute instructions for performing the operations and steps discussed herein.

The machine-readable storage medium (also known as a computer-readable medium) on which is stored one or more sets of instructions or software embodying any one or more of the methodologies or functions described herein. The machine-readable storage medium can be, for example, memory device 100 or another memory device. The term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can comprise a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

It will also be appreciated that various modifications may be made without deviating from the disclosure. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

We claim:

1. An apparatus, comprising:
a plurality of main word line circuits, each of the main word line circuits configured to drive a respective global word line to one of an active state, an intermediate voltage state, or a pre-charge state;
a plurality of sub-word line drivers, each sub-word line driver connected to a corresponding global word line and configured to drive a respective local word line between a value of the corresponding global word line and a value of a low voltage source based on a first phase signal and a second phase signal;
a plurality of phase drivers, each phase driver of the plurality of phase drivers configured to generate the respective first phase signal and the respective second phase signal, each phase driver connected to a predetermined number of sub-word line drivers of the plurality of sub-word line drivers, where each of the predetermined number of sub-word line drivers connects to a different global word line; and
a processing device operatively coupled to each of the main word line circuits, the processing device configured to drive the respective global word line to the intermediate voltage state prior to entering the pre-charge state when transitioning from the active state to the pre-charge state so as to provide row hammer stress mitigation between adjacent local word lines corresponding to the plurality of sub-word line drivers,
wherein a voltage level of the intermediate voltage state is below a voltage level of the active state and above a voltage level of the pre-charge state.

2. The apparatus of claim 1, wherein the predetermined number of sub-word line drivers is seven.

3. The apparatus of claim 1, wherein the voltage level of the intermediate voltage state is in a range of 0.25 volts to 0.75 volts.

4. The apparatus of claim 1, wherein the voltage level of the intermediate voltage state is 0.5 volts.

5. The apparatus of claim 1, wherein each sub-word line driver of the plurality of sub-word line drivers includes a PMOS transistor to pull-up the respective word line to the value of the corresponding global word line based on the first phase signal, and a NMOS transistor to pull-down the respective word line to the value of the low voltage source based on the second phase signal.

6. The apparatus of claim 1, wherein each sub-word line driver of the plurality of sub-word line drivers exclusively uses NMOS transistors.

7. The apparatus of claim 6, wherein each of the plurality of phase drivers includes,
a first driver circuit configured to set the first phase signal to a first high state value to drive the local word line to the value of the low voltage source, and
a second driver circuit configured to set the second phase signal to a second high state value that is higher than the active state voltage level of the respective local word line to drive the local word line to one of the active state voltage level or the intermediate voltage state voltage level,
wherein the second driver circuit includes a stabilization circuit configured to provide a resistive path for a leakage current in the second driver circuit when the second phase signal is at the second high state value.

8. The apparatus of claim 7, wherein the stabilization circuit includes a first continuously gated transistor and a second continuously gated transistor, and
wherein a first gate voltage of the first continuously gated transistor is in a range of 3.8 volts to 4.7 volts, and a first gate voltage of the second continuously gated transistor is in a range of 1.5 volts to 3.2 volts.

9. The apparatus of claim 7, wherein each of the plurality of phase drivers is configured to receive a decoded row address signal and a first timing signal, and a value of the first phase signal is based on the decoded row address signal and the first timing signal, and
wherein each phase driver is further configured to receive a second timing signal, and a value of the second phase signal is based on the first phase signal and the second timing signal.

10. The apparatus of claim 7, wherein the first driver circuit includes at least one PMOS transistor to drive the first phase signal to the first high state value, and
wherein the at least one PMOS transistor is connected to a source voltage with a value in a range of 2.5 volts to 3.2 volts.

11. The apparatus of claim 7, wherein the second driver circuit includes at least one PMOS transistor to drive the second phase signal to the second high state value, and
wherein the at least one PMOS transistor is connected to a source voltage with a value in a range of 3.8 volts to 4.7 volts.

12. The apparatus of claim 6, wherein each of the sub-word line drivers of the plurality of sub-word line drivers includes,
a pull-up circuit configured to receive the first phase signal and a global word line signal, the pull-up circuit further configured to drive the respective local word line to follow the global word line signal when the first phase signal is at a first value and isolate the respective local word line from the global word line signal when the first phase signal is at a second value, and
the processing device operatively coupled to the respective phase driver circuit, the processing device configured to,
set the first phase signal to the first value prior to the respective global word line signal having the active state voltage level, and
set the first phase signal to the second value only after the respective global word line signal has the pre-charge state voltage level.

13. The apparatus of claim 12, wherein each of the sub-word line drivers of the plurality of sub-word line drivers includes,
a pull-down circuit that is configured to receive the second phase signal and a low voltage signal, the pull-down circuit further configured to drive the local word line to follow the low voltage signal when the second phase signal is at a third value and isolate the local word line from the low voltage signal when the second phase signal is at a fourth value, and
wherein the processing device sets the second phase signal to the third value at a same time as the first phase signal is set to the first value and sets the second phase signal to the fourth value at a same time as or after the first phase signal is set to the second value.

14. The apparatus of claim 1, wherein the each of the plurality of main word line circuits includes,
a RF driver circuit configured to provide a first row factor signal and a second row factor signal; and
a main word line driver circuit including,
a pull-up circuit configured to receive the first row factor signal and configured to drive the global word line to the active state voltage level when the first row factor signal is at a first value and isolate the global word line from the active state voltage level when the first row factor signal is at a second value, and
an intermediate voltage circuit configured to receive the first and second row factor signals, the intermediate voltage circuit further configured to drive the global word line to follow a value of the second row factor signal when the first row factor signal is at the second value,
wherein the value of the second row factor signal is at the intermediate voltage stage voltage level.

15. The apparatus of claim 14, further comprising:
a second pull-down circuit configured to receive a decoded address signal and configured to drive the global word line to the pre-charge state voltage level if the decoded address signal is at a high value.

16. The apparatus of claim 14, wherein the RF driver circuit receives a timing signal, and
wherein the RF driver circuit is configured such that the first row factor signal is set to the first value based on a first state of the timing signal and is set to the second value based on a second state of the timing signal, the second state being opposite the first state.

17. The apparatus of claim 15, wherein the RF driver circuit receives a first timing signal and a second timing signal,
wherein the RF driver circuit is configured such that the second row factor signal has the intermediate voltage state voltage level when the first timing signal is at a first state and the second timing signals is at a second state that is opposite the first state.

18. The apparatus of claim 15, wherein the pull-up circuit includes a PMOS transistor with a gate connected to the first row factor signal, a source connected to the first decoded address signal, and a drain connected to the global word line,
  wherein the intermediate voltage circuit includes a first NMOS transistor with a source connected in series to a drain of a second NMOS transistor, the gate of the first NMOS transistor connected to the first decoded address signal and the gate of the second NMOS transistor connected to the first row factor signal, the source of the second NMOS transistor connected to the second row factor signal and the drain of the first NMOS transistor connected to the global word line, and
  wherein the pull-down transistor includes a third NMOS transistor with a gate connected to the second decoded address signal, a source connected to a low voltage signal, and a drain connected to the global word line.

* * * * *